(12) United States Patent
Hessel et al.

(10) Patent No.: US 7,543,119 B2
(45) Date of Patent: Jun. 2, 2009

(54) VECTOR PROCESSOR

(76) Inventors: Richard Edward Hessel, 3226
Flemington Ct., Pleasanton, CA (US)
94588; Nathan Daniel Tuck, 82
Benthaven Pl., Boulder, CO (US) 80305;
Korbin S. Van Dyke, 3343 Little Valley
Rd., Sunol, CA (US) 94586; **Chetana N.
Keltcher**, 878 Hollenbeck Ave.,
Sunnyvale, CA (US) 94087

( * ) Notice: Subject to any disclaimer, the term of this patent is extended or adjusted under 35 U.S.C. 154(b) by 241 days.

(21) Appl. No.: 11/352,192

(22) Filed: Feb. 10, 2006

(65) Prior Publication Data

US 2007/0255894 A1 Nov. 1, 2007

Related U.S. Application Data

(60) Provisional application No. 60/652,123, filed on Feb. 10, 2005.

(51) Int. Cl.
*G06F 12/00* (2006.01)
(52) U.S. Cl. .......................... 711/154; 712/2
(58) Field of Classification Search ................ None
See application file for complete search history.

(56) References Cited

U.S. PATENT DOCUMENTS

| 4,710,867 | A | * | 12/1987 | Watanabe | 712/8 |
| 4,794,521 | A | * | 12/1988 | Ziegler et al. | 711/130 |
| 4,916,652 | A | * | 4/1990 | Schwarz et al. | 708/510 |

* cited by examiner

*Primary Examiner*—Brian R Peugh
(74) *Attorney, Agent, or Firm*—West & Associates, A PC; Charlotte Rodeen-Dickert; Stuart J. West

(57) ABSTRACT

A vector processing system provides high performance vector processing using a System-On-a-Chip (SOC) implementation technique. One or more scalar processors (or cores) operate in conjunction with a vector processor, and the processors collectively share access to a plurality of memory interfaces coupled to Dynamic Random Access read/write Memories (DRAMs). In typical embodiments the vector processor operates as a slave to the scalar processors, executing computationally intensive Single Instruction Multiple Data (SIMD) codes in response to commands received from the scalar processors. The vector processor implements a vector processing Instruction Set Architecture (ISA) including machine state, instruction set, exception model, and memory model.

15 Claims, 32 Drawing Sheets

| ISEL | IRD | RRD1 | RRD2 | X1A | X2A/X1B | X3A/X2B | X4A/X3B | X5A/X4B | MA/X5B | MB | RWR | COM | | | | | | | | |
|---|---|---|---|---|---|---|---|---|---|---|---|---|---|---|---|---|---|---|---|---|
| | ISEL | IRD | RRD1 | RRD2 | X1A | X2A/X1B | X3A/X2B | X4A/X3B | X5A/X4B | MA/X5B | MB | RWR | COM | | | | | | | |
| | | ISEL | IRD | RRD1 | RRD2 | X1A | X2A/X1B | X3A/X2B | X4A/X3B | X5A/X4B | MA/X5B | MB | RWR | COM | | | | | | |
| | | | IRD | RRD1 | RRD2 | X1A | X2A/X1B | X3A/X2B | X4A/X3B | X5A/X4B | MA/X5B | MB | RWR | COM | | | | | | |
| | | | | ISEL | IRD | RRD1 | RRD2 | X1A | X2A/X1B | X3A/X2B | X4A/X3B | X5A/X4B | MA/X5B | MB | RWR | COM | | | | |

VECTOR PROCESSOR

CROSS REFERENCE To RELATED APPLICATIONS

Priority benefit claims for this application are made in the accompanying Application Data Sheet. This application incorporates by reference for all purposes the following applications, which are all owned by the owner of the instant application: U.S. Provisional Application Ser. No. 60/772, 312 filed Feb. 9, 2006 by *TBD* Hessel, et al., and entitled Vector Processing System Instruction Set."

FIELD OF THE INVENTION

This invention relates generally to computer processing. More specifically, it relates to computer processing of vector operands.

BRIEF DESCRIPTION OF THE DRAWINGS

FIG. 8 illustrates an example of startup operation of an embodiment of the FLane pipeline.

Figure 1:
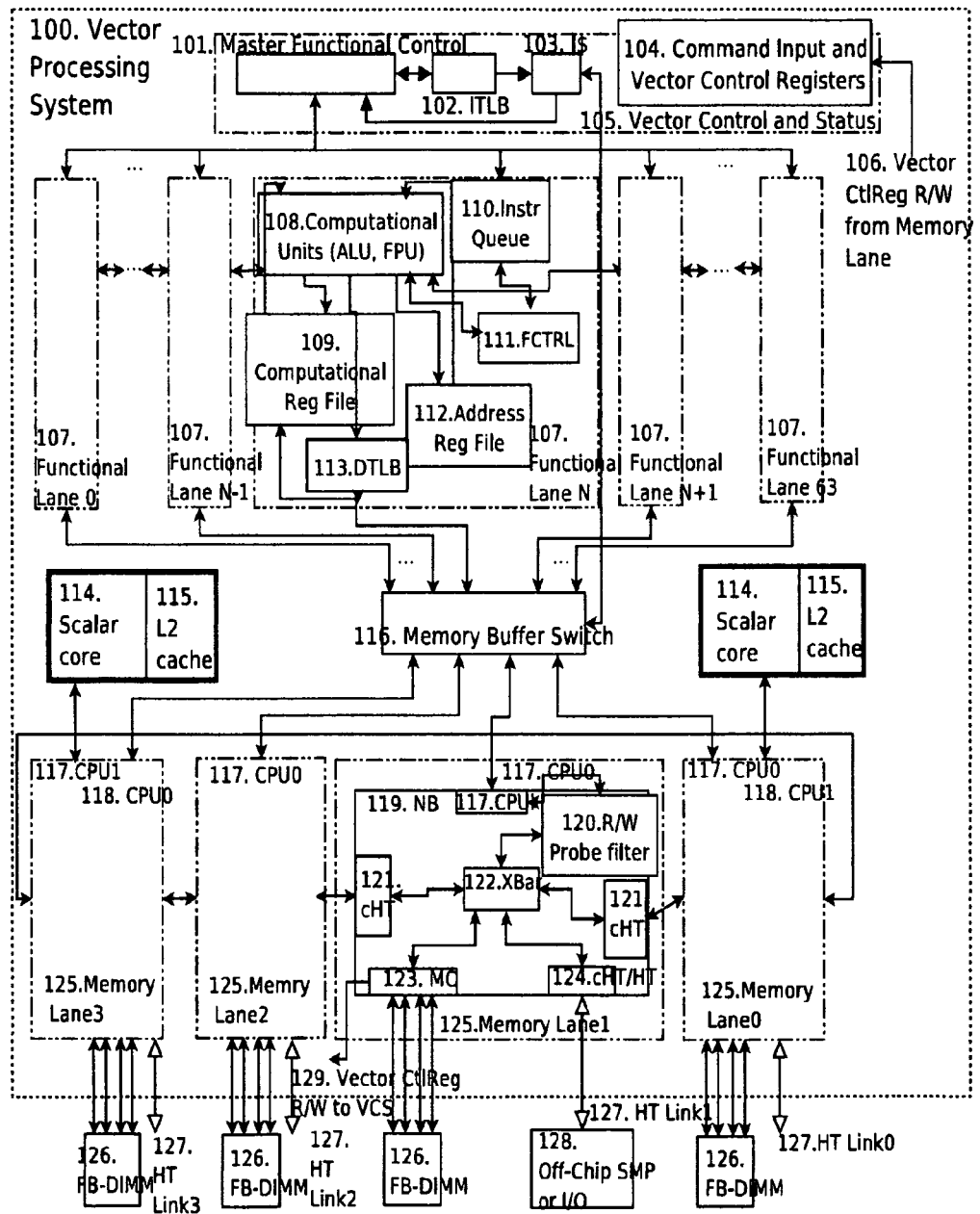
FIG. 1 illustrates a high level view of an embodiment of a Vector Processing System (VPS).

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

REFERENCES

References providing additional information include: a presentation made by Fred Weber at the 2002 Microprocessor Forum entitled "AMD Opteron Processor for MP Server Systems". All of the foregoing references are herein incorporated by reference for all purposes.

INTRODUCTION

This introduction is included only to facilitate the more rapid understanding of the Detailed Description. The invention is not limited to the concepts presented in the introduction, as the paragraphs of any introduction are necessarily an abridged view of the entire subject and are not meant to be an exhaustive or restrictive description. For example, the introduction that follows provides overview information limited by space and organization to only certain embodiments. There are in fact many other embodiments, including those to which claims will ultimately be drawn, which are discussed throughout the balance of the specification. As is discussed in more detail in the Conclusions, the invention encompasses all possible modifications and variations within the scope of the issued claims, which are appended to the very end of the issued patent.

High Level Overview

A VPS provides high performance vector processing using a System-On-a-Chip (SOC) implementation technique. One or more scalar processors (or cores) operate in conjunction with a vector processor, and the processors collectively share access to a plurality of memory interfaces coupled to Dynamic Random Access read/write Memories (DRAMs). In typical embodiments the vector processor operates as a slave to the scalar processors, executing computationally intensive Single Instruction Multiple Data (SIMD) codes in response to commands received from the scalar processors. The vector processor implements a vector processing Instruction Set Architecture (ISA) including associated machine state, instruction set, exception model, and memory model.

FIG. 1 is a block diagram of an embodiment of a VPS 100 including two scalar processors 114 and a vector processor having 64 FLanes 107, an MBS 116, and four MLanes 125 for accessing Input/Output (I/O) and memory capabilities.

The ICache 103 in the Vector Control and Status block 105 holds vector instructions which are sent to all the 64 FLanes 107. The FLanes 107 are each capable of one 64-bit integer or two single precision floating-point or one double precision floating point operation each cycle. A large Computational Register File (CRF) 109 per lane feeds these units. Inter FLane communication is enabled with direct connections between adjacent lanes. Memory requests (loads and stores) from all the FLanes 107 are sent to the MBS 116 which sends each request to one of the four MLanes 125 and returns read data to the FLanes 107. Each MLane 125 has a Northbridge block and the Northbridges are connected via coherent HyperTransport (cHT) 121 links to provide coherent memory access to the 16 FB-DIMM channels 126.

In some embodiments the VPS 100 is implemented on a single integrated circuit die, as suggested by the dashed-box in the figure. In some embodiments the scalar cores and associated L2 caches are implemented on one or more separate die. Those of ordinary skill in the art will recognize other possible die partitioning options.

The number of FLanes 107 (active and spare) and the number of scalar cores (and associated L2 cache 115 sizes) vary according to embodiment. Some embodiments include 64 active FLanes 107 and no spares, while other embodiments include 64 active FLanes 107 and four spares. Some embodiments include a single scalar core 114, while other embodiments include a pair of scalar cores 114. Some embodiments include 1 MB of L2 cache 115, while other embodiments include 2 MB of L2 cache 115.

Programming Model

Programs that run on the VPS 100 are typically compiled with a vectorizing compiler (VC) having knowledge of the vector processor ISA. In some embodiments the compiler incorporates dynamic optimization techniques in addition to static optimizations. In some embodiments the scalar core is compatible with the industry standard X86 ISA. In some usage scenarios X86 code is executed without optimization to the vector processor ISA, and receives the benefit of the vector processor memory subsystem.

The VC analyzes vectorizable loops and generates a block (or blocks) of vector instructions. The scalar core dispatches commands to the vector processor to fetch and execute the blocks of vector instructions. The VC performs state-of-the-art dependency analysis and optimization. Special attention is paid to blocking (a.k.a. tiling) multiple loops to reuse data from the vector registers and minimize memory traffic. In some embodiments the VC is a derivative of the PathScale compiler.

A large number of vector registers (implemented in the CRF 109), typically 512 registers of 128-64 bit entries each, are provided to allow kernels to be vectorized without the need to write intermediate results to memory. This allows the vector processor to perform as well as stream processors provided the loops do not contain loop-carried dependencies.

Memory Ordering and Coherence

Vector memory operations are coherent with respect to the scalar processor 114 cache. However, memory operations in the vector processor are not coherent among themselves. In fact they are not even ordered. Independent loads and stores to the same memory location may bypass each other. It is the responsibility of the compiler or programmer to insure that there are no memory conflicts through the use of synchronization primitives. A set of synchronization instructions are provided to allow the scalar processor 114 to guarantee that stores are safely in memory. The compiler or programmer must issue these instructions when needed to guarantee program correctness.

SMP Support

In some embodiments, the vector processor supports a gluless SMP scheme, such as that provided by AMD Opteron processors via cHT links, enabling memory references to or from other vector processors or scalar cores to be coherently addressed by the vector processor. As the bandwidth available to memory coupled to remote nodes is lower than local memory bandwidth (and the latency higher), in typical embodiments application programs and the compiler attempt to minimize remote memory accesses.

Memory Organization

Figure 2:
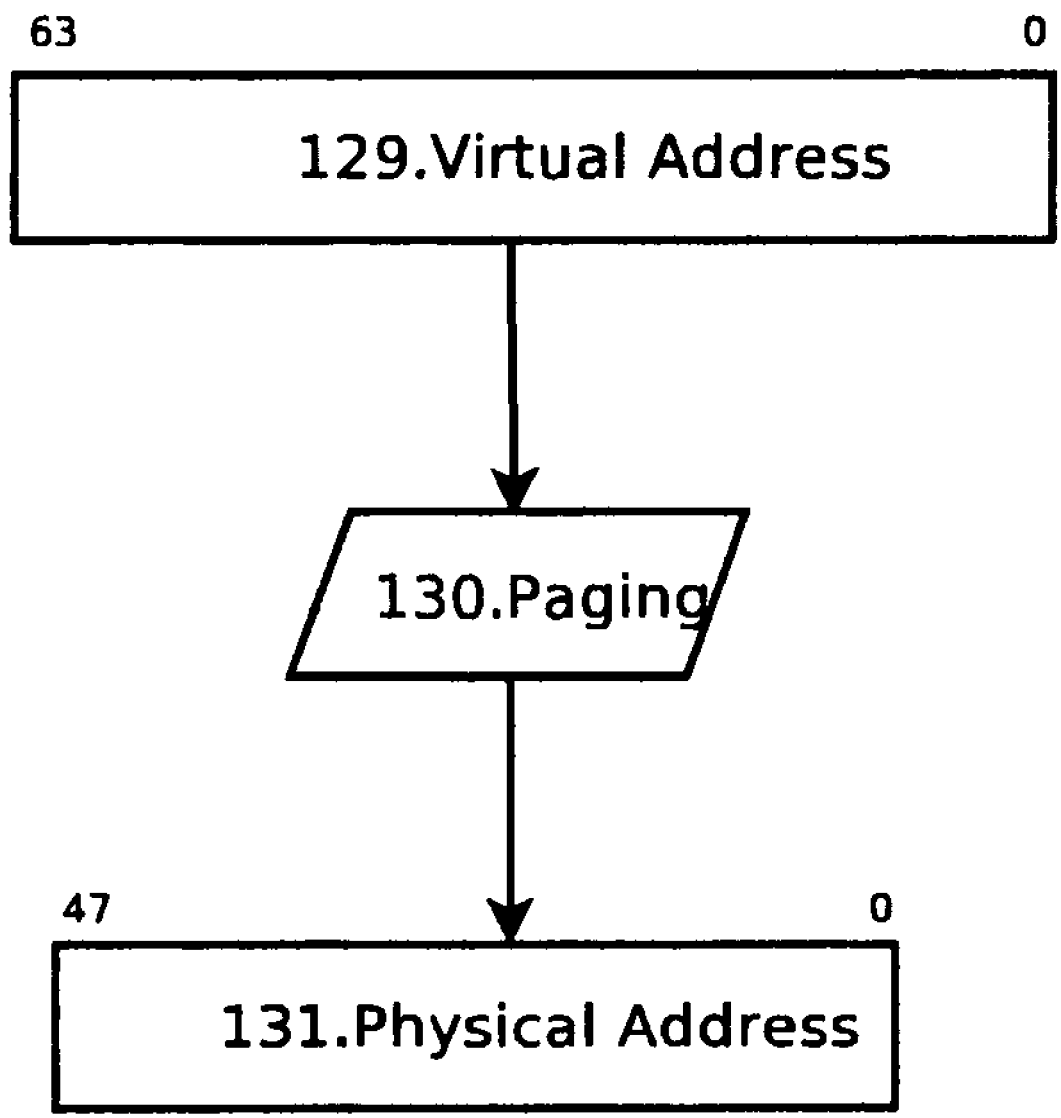
FIG. 2 illustrates an embodiment of memory addressing in the VPS.

The vector processor supports the full virtual and physical address space of any scalar processor it is coupled with. Thus if the scalar processor supports 64-bits of virtual address and 48-bits of physical address, then FIG. 2 shows the flow where programs generate virtual addresses 129 that can be up to 64-bits in size. The virtual addresses are passed through the vector paging function 130, which generates physical addresses 131 that can be up to 48-bits in size. In some embodiments the physical address 131 is limited to 44 bits.

VCS

Figure 3:
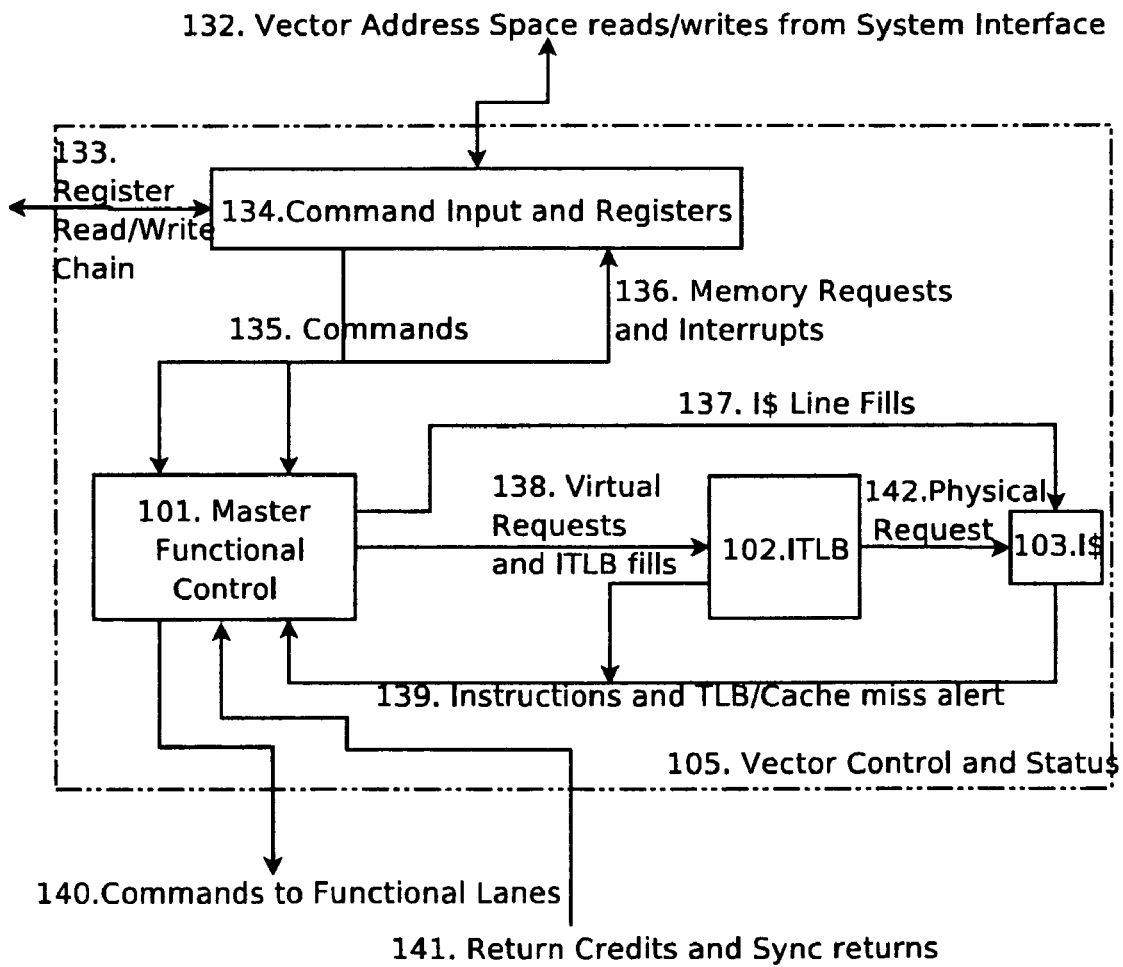
FIG. 3 illustrates an embodiment of a Vector Control and Status (VCS) block.

The VCS block 105, shown in FIG. 3, is the master of the independent FLanes. Its primary function in normal operation is to fetch instructions from the ICache 103 and send them to the individual FLanes 140. An ITLB 102 is used for address translation. The VCS 105 also controls access to status/control registers 134 within the rest of the vector processor.

Command Input and Registers

Figure 4:
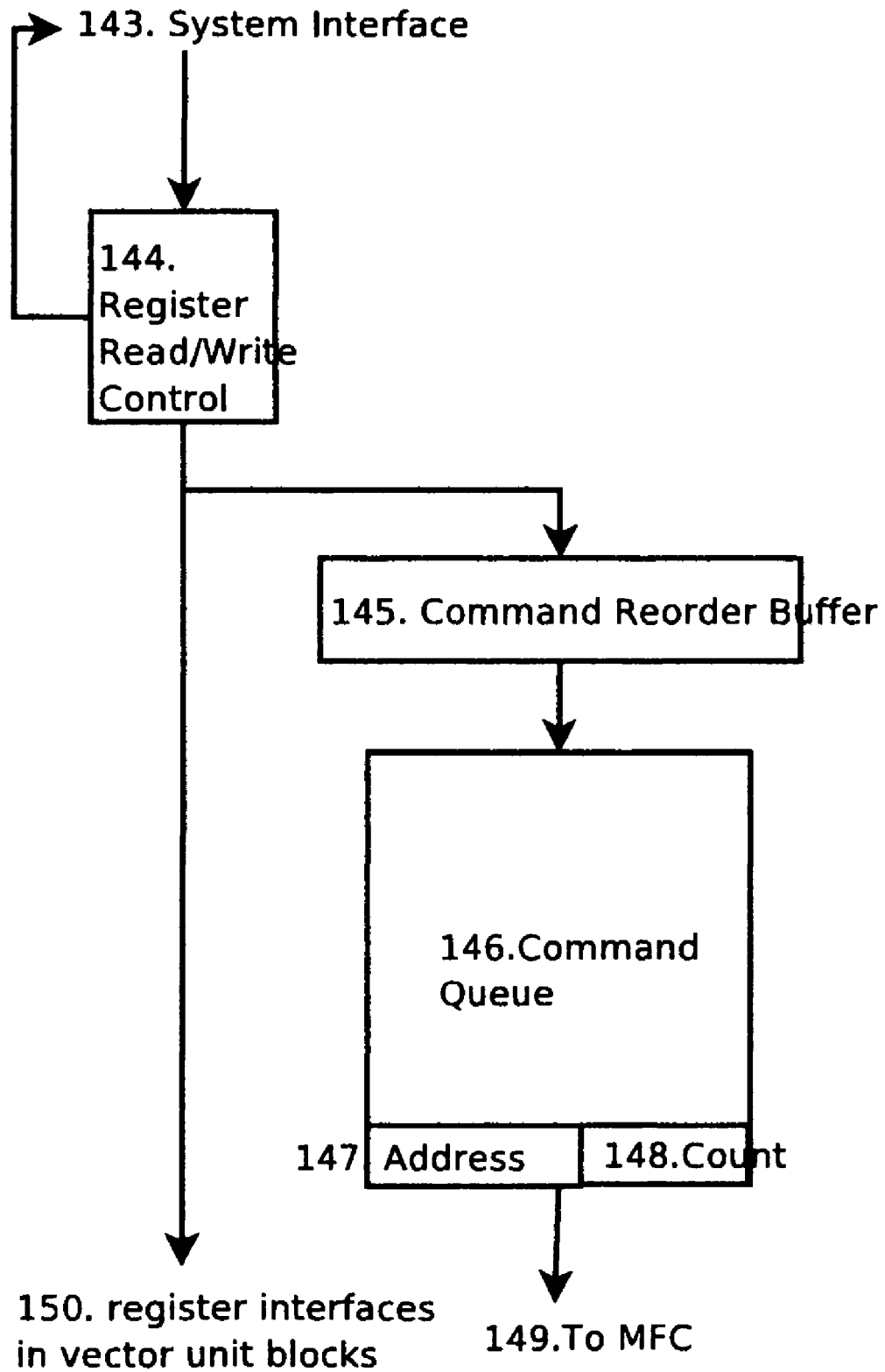
FIG. 4 illustrates an embodiment of a Command Input and Registers (CIR) block.

The CIR block as shown in FIG. 4 provides the front end interface for the vector processor. All I/O reads and writes within the vector processor device address space are first sent to this block. Register reads are responded to from this block. In various embodiments the vector processor registers (or a subset thereof, according to embodiment) are assigned a portion of PCI configuration space, similar to Northbridge control registers. In some embodiments a Memory Control (MC) block of a designated one of the Northbridges provides an interface to couple to CIR to enable PCI configuration space access of vector processor registers. The MC appears as an I/O device to scalar cores, accepting writes and providing read data thereto.

Incoming reads and writes are sent into the register read/write control by the system interface 143. The read/write control 144 sends register writes out to the rest of the system and handles the internal transactions for reads before returning the read data on the system interface 143. In some embodiments vector processor register state is communicated via scan-chain functionality, for reads and writes.

Writes that fall within the command queue address range are sent to a command reorder buffer 145. Only writes are valid within this address range. The command reorder buffer 145 is used to coalesce command writes sent to the vector processor through a write-combining address space of one of the scalar processors. This is managed as follows, the host processor writes to the command input queue 146 in a sequential fashion, starting at the base address of the command input queue and wrapping back to the start address every 1 KB. The command reorder buffer 145 acts as a window that collects the commands (which are possibly arriving out of order) and writes them in order to the command queue. The command queue 146 then hands address and count values one at a time to the MFC 149.

Registers

| Register Name | Bit Width | R/W |
| --- | --- | --- |
| CRB Reset Valid Commands | 1 | W |
| CRB Last Valid Command | 10 | R/W |
| Command Queue[128] | 64 | R/W |
| Command Valid Bits[2] | 64 | R/W |

Circuit Macros

| Name | Count |
| --- | --- |
| 1 KB dual ported ECC RAM (128 × 72 bit) | 1 |
| 128 × 1 bit dual ported RAM | 1 |

ITLB

Figure 5:
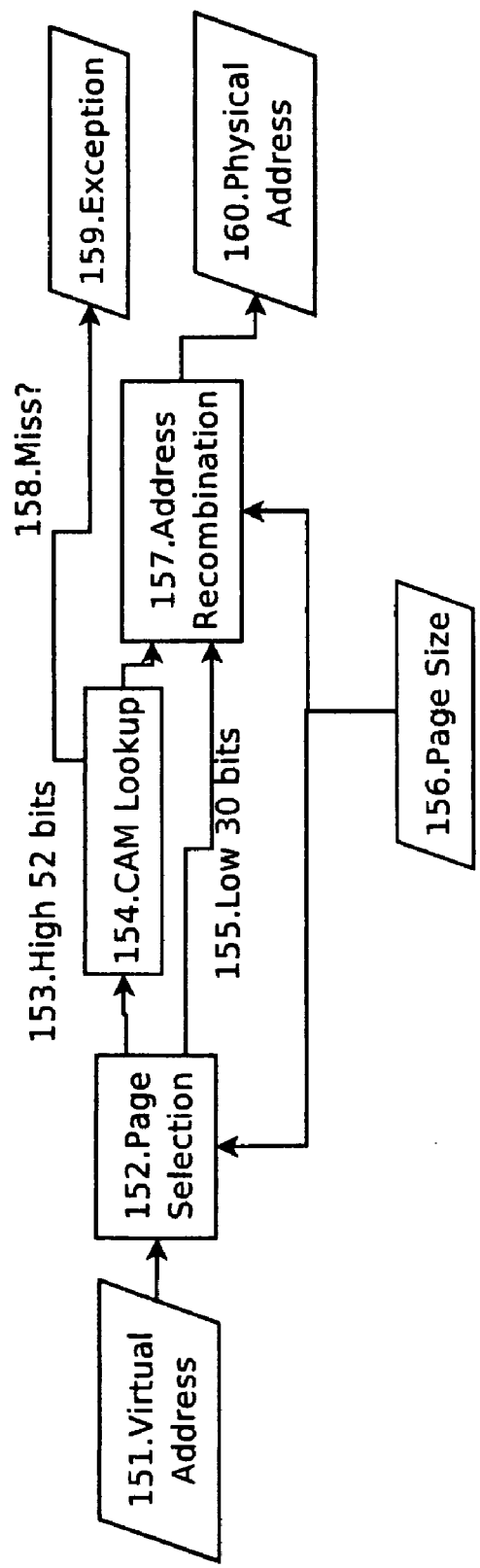
FIG. 5 illustrates an embodiment of an Instruction Translation Look-aside Buffer (ITLB).

The ITLB shown in FIG. 5 has sixteen fully associative entries and performs logical to physical address translation of code addresses. The ITLB supports page sizes from 4 KB to 1 GB. In some embodiments variable page sizes are implemented by a variable shift on the input address. On a miss, in some embodiments, the ITLB raises an exception to the scalar processor and waits for the ITLB miss to be filled by the scalar processor (software fill). In other embodiments the ITLB includes a page-walking block to implement ITLB fills without assistance from the scalar processor (hardware fill).

Registers

| Name | Width | R/W |
| --- | --- | --- |
| Invalidate ITLB | 1 | W |
| ITLBVaddr[16] | 64 | R/W |
| ITLBPaddr[16] | 64 | R/W |
| ITLBValid[16] | 1 | R/W |
| ITLBPageSize | 64 | R/W |
| ITLBExceptionRaised | 1 | R |
| ITLBExceptionAddr | 64 | R |

In embodiments where the ITLB is filled by software (executed on one of the scalar processors), there are registers for writing the entries of the ITLB. In embodiments where the ITLB is filled by hardware (i.e. the page-walking block), there are registers storing page table location state (pointers to memory) that are compatible with the paging system of the scalar core.

Circuit Macros

| Name | Count |
| --- | --- |
| 16 entry CAM (52 bit tag + 1 valid bit) | 1 |
| 16 entry PTE (36 bit data + multi-bit page info) | 1 |

Instruction Cache (ICache)

The ICache is a 32 KB 2-way set associative structure with 64 byte lines of 64 bit instruction words. This allows 4K computational instructions to be resident in the cache. Each 64-bits of data is protected by 8-bits of SECDED ECC. The VCS does not force the individual FLanes to execute in lock-step except when there is a synchronization command in the instruction stream. The ICache tags are large enough to support the full physical address space of any scalar processor they are coupled with. When there is an ICache miss, a memory request is issued to the MBS (also known as a switching network) to retrieve the memory from the appropriate Northbridge (which may then in turn retrieve the data via HT).

Figure 6:
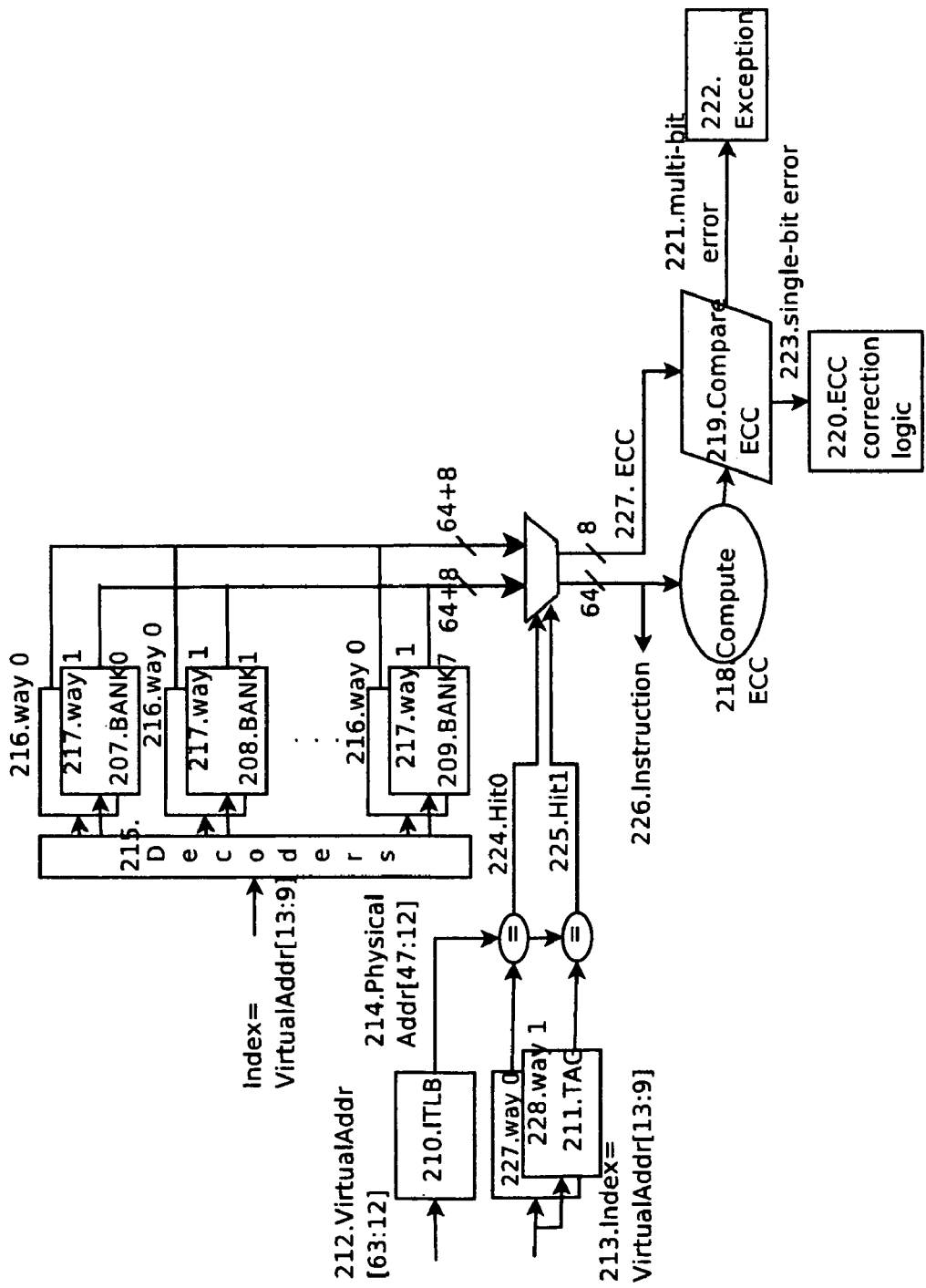
FIG. 6 illustrates an embodiment of an Instruction Cache (ICache) in an operating context.

FIG. 6 shows a virtually-indexed, physically-tagged implementation of the ICache. In some embodiments the ICache and associated interface are enabled to provide one instruction per clock, and in other embodiments to provide two or more instructions per clock.

Registers

| Name | Width | R/W |
| --- | --- | --- |
| Flush ICache | 1 | W |

Circuit Macros

| Name | Count |
|---|---|
| 32 KB single ported ECC RAM (4096 × 72 bit) | 1 |
| 512 entry single ported tag RAM (36 bit tag + 1 valid bit) | 1 |

Master Functional Control (MFC)

The MFC is responsible for sequencing the issue of commands across the FLanes. It removes start address and count commands from the Command Queue and then interacts with the ITLB and ICache to retrieve instructions and dispatch them to the FLanes.

While there are valid commands in the Command Queue, the MFC removes them one at a time and sends virtual address requests to the ITLB. A number of cycles later, either an instruction or an indication of an Icache or ITLB miss comes back to the MFC. If a miss is detected, the MFC issues the appropriate memory requests to fill the ICache.

When the instruction is received successfully (from the ICache), the MFC examines the instruction to determine if it is a sync instruction. If the instruction is not a sync, then it can be broadcast to the FLanes when there is an available credit for all FLanes. If the instruction is a sync send instruction, then the MFC sets the appropriate sync counter to its maximum value (64, the number of FLanes) prior to sending out the sync as a normal instruction. If the instruction is a sync harvest instruction, then the MFC blocks sending instructions until such time as the appropriate sync counter has been decremented to zero. In some embodiments sync harvests are not sent to the FLanes. In other embodiments sync harvests are sent to the FLanes, but the FLanes treat them as no-operations (NOPs).

In some embodiments, the MFC is programmed at initialization time with a number of credits allowed for each FLane. Each time an instruction is sent to an FLane, the MFC increments the corresponding credit counter. When a credit is returned, the corresponding credit counter is decremented by the MFC. When any credit counter is equal to the maximum, the MFC can no longer send commands to any FLane. When a synchronization instruction appears, the MFC flash copies the current credit count for each FLane to a set of synchronization credit counters. The synchronization counters ate only decremented similarly to the master credit counters, but are not incremented when new instructions are sent out. When all the synchronization credit counters corresponding to a given sync are zero, the sync can be considered to have completed.

Predication based on vector masks is handled by the FLanes, as the MFC broadcasts all instructions to all FLanes. The MFC merely handles sequencing and flow control of the instructions.

The MFC is capable of delivering twice as many instructions in steady-state as the FLanes are capable of executing. The reasoning for this is twofold. First, it allows the MFC to partially cover ICache misses. Secondly, it allows the FLanes to operate in split mode at close to full efficiency on short vectors.

Registers

| Name | Width | R/W |
|---|---|---|
| BaseCredits[64] | 7 | R/W |
| CurrentCredits[64] | 7 | R/W |
| SyncCounter[NUM_SYNCS][64] | 6 | R/W |
| SyncHarvesting | 1 | R |

Circuit Macros

| Name | Count |
|---|---|
| 64 input 1-bit Wallace tree | 1 |
| 7 bit adder | 65 |
| NUM_SYNCS × 7 bit single ported RAM | 1 |

Functional Lane (FLane)

An FLane is a bundling of a vector computational path. It contains an instruction queue (IQ), control logic for issuing instructions (FCTRL), a slice of the CRF, a slice of the ARF, and a Data Translation Look-aside Buffer (DTLB).

FLane Pipeline

Pipeline Stages

Note that in the following description there are two vector entries per instruction at the functional unit, multiple stages of execution for various similar operations, and four register operands. Therefore the term stage must be interpreted according to context, as it may correspond to a single clock or to multiple clocks.

ISEL—Reads the next four instructions from the IInfo-Queue and determines based on their current vector mask which can be issued next. If the current mask status of the first non-squashed instruction cannot be determined, it is held at this pipe stage until the vector mask is resolved.

IRD—Reads the selected instruction from the IQ

RRD1—Reads operands A and B from the appropriate register file.

RRD2—Reads operand C from the register file. Detects whether A, B, and C are valid. If not, the instruction is held at this stage until the operands can be bypassed from stage X3 or from memory. In the case of multiple bypasses (which are possible) operand values read are replaced as they are made available.

X1A—first stage of execution for vector entry 1

X2A/X1B—second stage of execution for vector entry 1, first stage of execution for vector entry 2

X3A/X2B—third stage of execution for vector entry 1, second stage of execution for vector entry 2

X4A/X3B—fourth stage of execution for vector entry 1, third stage of execution for vector entry 2

X5A/X4B—fifth stage of execution for vector entry 1, fourth stage of execution for vector entry 2

MA/X5B—The DTLB is accessed for vector entry 1 in the case of load and store instructions and a virtual to physical translation is performed. In the case of loads, the address is sent to memory if the instruction is still non-exceptional. Fifth stage of execution for vector entry 2.

MB—The DTLB is accessed for vector entry 2 in the case of load and store instructions and a virtual to physical translation is performed. In the case of loads, the address is sent to memory if the instruction is still non-exceptional.

RWR—Writes a result back to the register file or to the vector mask register assuming no exceptions have been attached to the instruction.

COM—Commits the instruction. Any exceptions are detected and raised.

Pipeline Rules

RRD1 may not occur at the same time as RRD2 or RWR. RRD2 and RWR may occur at the same time.

The last stage for exceptions to be caught synchronously in the pipeline is RWR. Instructions that continue to RWR and COM are assumed to commit safely. In the case of stores, any exception after the DTLB check happens asynchronously.

In the case that an instruction is held up at RWR by a lack of available results (because it is a load), all subsequent 127 instructions can "skid" one at a time into stage MB without stalling if there are no dependencies. Results from these skidded instructions are held and forwarded to subsequent instructions. When the instruction stalled at RWR completes its write, the skidded instructions are fed one at a time into RWR.

Simple Pipeline Examples

Figure 7:
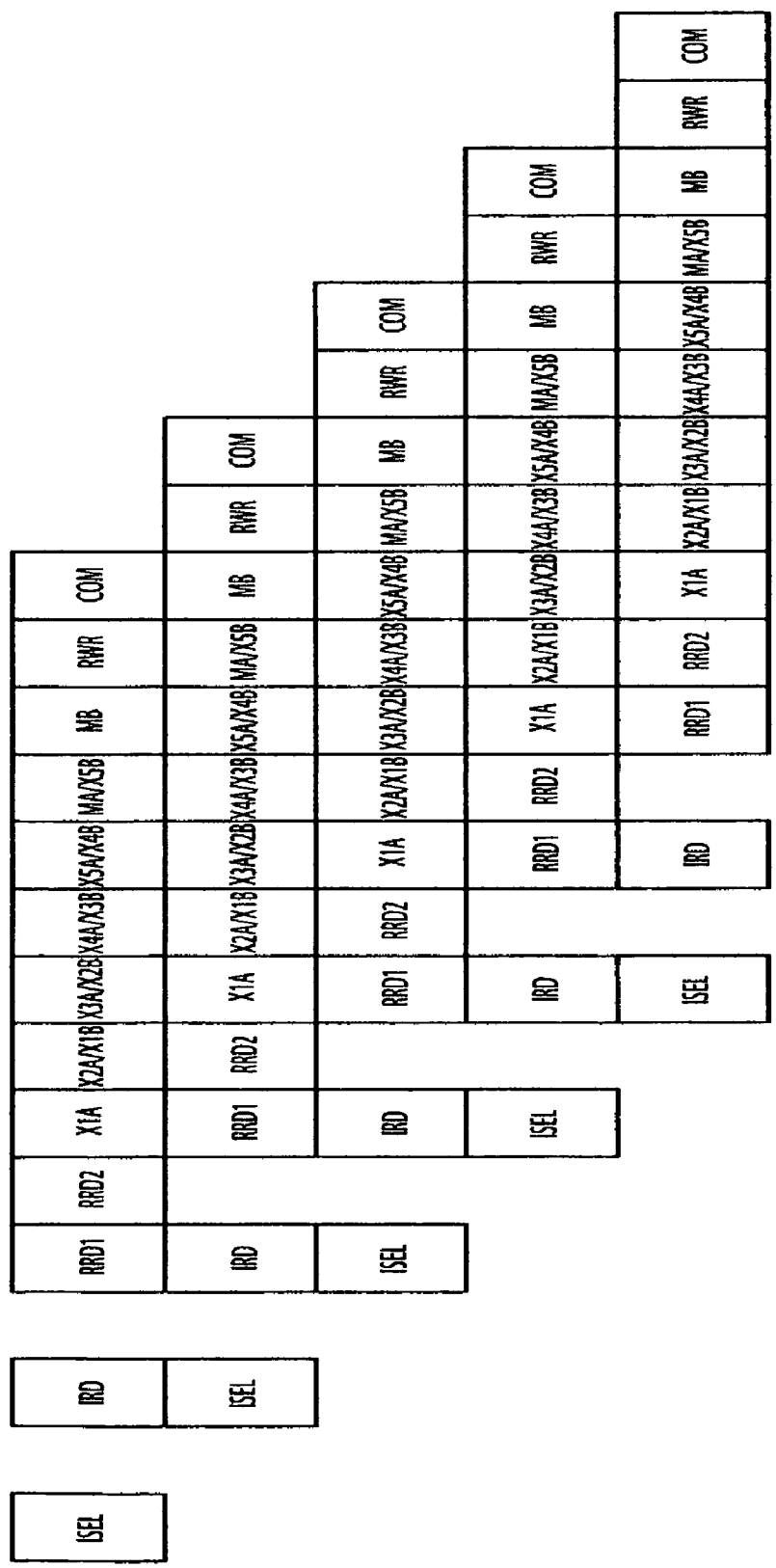
FIG. 7 illustrates steady state operation of an embodiment of a Functional Lane (FLane) pipeline.

FIG. 7 shows steady-state operation of the pipeline with an instruction mix of completely non-dependent, non-memory accessing instructions. Note that by default there is a one cycle stall between ISEL and IRD and between IRD and RRD1. This bubble enables improved performance in cases where the vector mask is false.

FIG. 8 shows the pipeline startup with non-dependent, non-memory accessing instructions.

More Complicated Pipeline Examples

Figure 9:
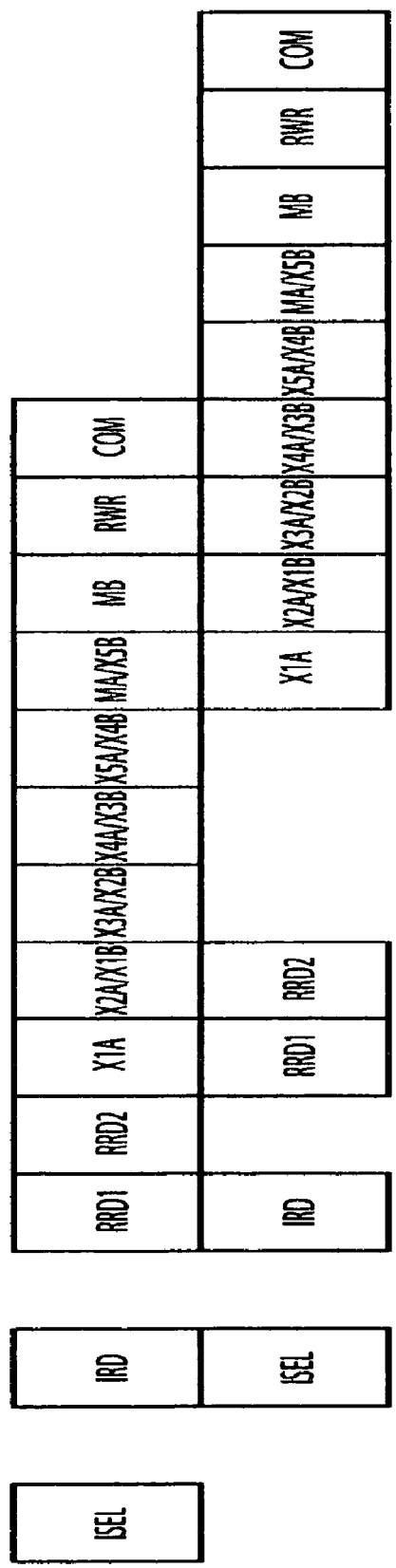
FIG. 9 illustrates an example of dependent instruction operation in an embodiment of the FLane pipeline.

FIG. 9 shows the effect of an FP or ALU dependency upon the pipeline. An instruction can only proceed if all of its vector operands (with non-zero vector masks) are available from register values which are already known or can be safely bypassed. If not, then the instruction stalls at RRD2 prior to entering the first stage of execution.

Figure 10:
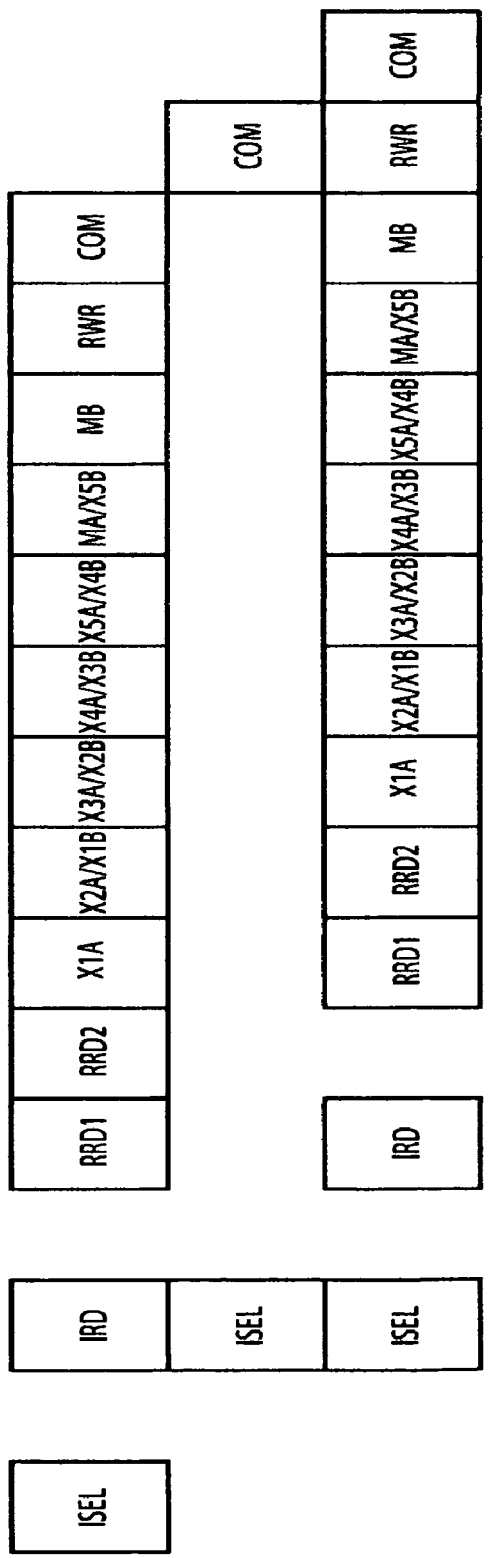
FIG. 10 illustrates an example of instruction squashing operation in an embodiment of the FLane pipeline.

FIG. 10 shows what happens when an instruction is known to have all zeros in the vector mask or if the vector length is less than the entry numbers. The instruction is squashed at ISEL and does not proceed through the rest of the pipeline. The instruction then commits as soon as possible. If only one vector mask of the two instructions is set to zero or if the vector length is less than one of the vector entry number, then the instruction executes as normal but one of the vector entries effectively generates the same result that was held in the register file.

IQ and Interface to Master Functional Control

The MFC sends instructions to each FLane and accepts backpressure from them. Every cycle, the MFC can broadcast two instructions or a command. Every cycle, the FLane can assert a return signal indicating that a credit is being returned or return a command response.

The IQ is a dual ported SRAM queue and is large enough to accept enough instructions to account for reasonable amounts of functional unit jitter without stalling the MFC. In some embodiments this corresponds to about 128 instructions (about 1 round-trip memory of drift between FLanes).

Figure 11:
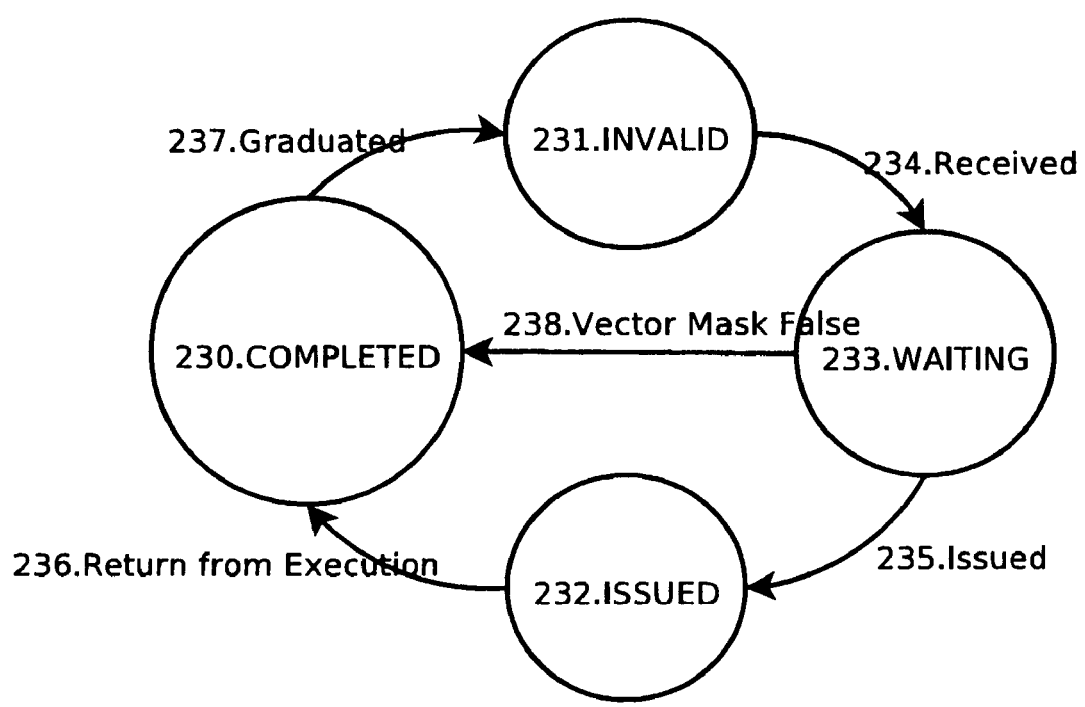
FIG. 11 illustrates an embodiment of instruction states.

Every instruction in the IQ is tagged with an extra 2-bit field indicating the instruction state. Possible values are INVALID 231, WAITING 233, ISSUED 232, and COMPLETED 230. An INVALID 231 instruction has not been received from the MFC. A WAITING 233 instruction has been received, but not yet been issued. An ISSUED 232 instruction has had all of its dependencies satisfied and has been dispatched to the appropriate functional units. A COMPLETED 230 instruction has completed execution, but has not been retired (thereby freeing up queue space and committing results). Retired instructions become INVALID 231 after retirement. FIG. 11 illustrates an embodiment of instruction states according to the aforementioned IQ entry tagging.

To execute predicate loops (IF statements), each instruction in the IQ has the vector mask portion of the instruction (2-bits to enable one double precision or two single precision operations) and an extra bit indicating whether the instruction is a setmask. This is stored in a separate 6-bit wide dual-ported SRAM called the IInfo queue.

Instructions enter the FLane referencing various vector masks. The vector masks may be modified by earlier instructions. Up to 4 instructions at a time are examined to determine at least the following:

Is this a vector mask which is modified by an instruction currently in the pipe?

If not, is the vector mask going to be a 1 or a 0?

If the vector mask is such that the instruction will not be executed, then the instruction can be squashed immediately to avoid a NOP bubble in the pipeline. This is enabled by writing six bits at a time into the IInfo queue (as instructions arrive) and reading 24 bits at a time (to do the query).

Registers

| Name | Width | R/W |
| --- | --- | --- |
| Instruction[128] | 64 | R |
| IState[128] | 2 | R |
| IInfo[128] | 6 | R |
| IQHead | 7 | R |
| IQIssueHead | 7 | R |
| IQGraduationHead | 7 | R |
| IQTail | 7 | R |

Circuit Macros

| Name | Count |
| --- | --- |
| Dual ported SRAM (128 × 64 bit) | 1 |
| Dual ported SRAM (128 × 2 bit) | 1 |
| SRAM (128 × 6 bit) | 1 |

Functional Control (FCTRL)

The FCTRL unit reads instructions from the IQ, issues them and tracks dependencies between them. The FCTRL advances through the instruction stream in-order, issuing instructions for which all the dependencies are satisfied. For instructions which use the FPU or ALU or move elements from the ARF to the CRF or vice-versa, the latency is deterministic. The FCTRL marks the appropriate resource with a timer value that indicates the cycle at which the destination will be ready. If a dependent instruction is found which has a result that is not ready, the FCTRL stalls until the result can be safely bypassed.

For loads, the return time is non-deterministic. FCTRL marks the resource as permanently unavailable (in some implementations this is a unique counter value) and stalls any dependent instructions until such time as the load returns. When the load value comes back it is placed in the register file, the resource is marked as available, and if the current instruction is dependent upon it, execution is started again.

Instruction Issue

The following discussion describes how an instruction is executed in an FLane. Wherever possible, described actions run in parallel.

Instructions are added to the location pointed by IQ Tail pointer.
The IQ Issue head pointer is compared to the tail pointer to determine if there are any instructions remaining to be issued. If not, the system remains idle.
If there are instructions to be executed, the next four instructions are read from the IInfo queue.
The first instruction which is guaranteed to have a vector mask that is set is scheduled for issue.
Instructions prior to it are marked as complete.
Register dependencies are checked for this instruction
If there are no unsatisfied dependencies, the instruction begins issue.
The register read part requires two cycles. For RA=RB*RC+RD, on the first (even) cycle, register RB and RC are read from the register file. On the second (odd) cycle, RD is read. Simultaneously with RD being read, results from completing instructions can be written to the register file.
Register values are sent to the COMP unit and any appropriate state is set.
The IQ Issue head pointer is updated.

Instruction Completion

When an instruction completes modifying state that is required for subsequent instructions, its IState entry is marked as COMPLETE. If the instruction at the IQIssueHead location in the queue is waiting for the result, it is bypassed and issued. Note that register values can only be written to the register file on "odd" cycles.

Instruction Graduation

When results for the instruction at the IQGraduationHead are committed to the register file (or the instruction has been squashed) the instruction can be graduated. Graduation involves marking the IState entry as INVALID and advancing the IQGraduationHead pointer.

Registers

| Name | Size | R/W |
|---|---|---|
| RegState[1024] | 4 | R |

Circuit Macros

| Name | Count |
|---|---|
| Dual ported SRAM (512 × 4 bit) | 2 |

Computational Register File (CRF)

The CRF is a register file containing a portion of the vector processor machine state, and feeds the functional units in the FLane. 512 64-bit vector registers of length 128 are provided. Thus, each of the 64 FLanes is responsible for two offsets in each vector register. FLane n operates on vector elements 2n and 2n+1.

The CRF datapath connects the lane FPU and ALU to the ARF.

Registers

| Name | Width | R/W |
|---|---|---|
| RegisterValue[1024] | 64 | R/W |
| RegisterBroadcastValue[512] | 64 | W |

Circuit Macros

| Name | Count |
|---|---|
| Dual ported SRAM (512 × 144 bit) | 1 |

Address Register File (ARF)

The ARF contains a portion of the vector processor machine state associated with address generation for loads and stores. The ARF is smaller than the CRF, and in some embodiments includes 32×128 64-bit entries. The ARF is dual ported to enable two register reads or a read and a write per cycle.

Registers

| Name | Width | R/W |
|---|---|---|
| RegisterValue[64] | 64 | R/W |
| RegisterBroadcastValue[32] | 64 | W |

Circuit Macros

| Name | Count |
|---|---|
| Dual ported SRAM (32 × 72 bit) | 2 |

Logical Address Generation (LAG)

In some embodiments a Logical Address Generation function receives values from the ARF and adds appropriate offsets from the instruction as well as any offset from the vector offset and stride. The LAG operations include integer multiply and add. In some embodiments dedicated hardware blocks perform these operations solely for address generation, while in other embodiments the multiply operation is performed by hardware shared for other functions (such as vector data computations).

Computation Units (COMP)

Figure 12:
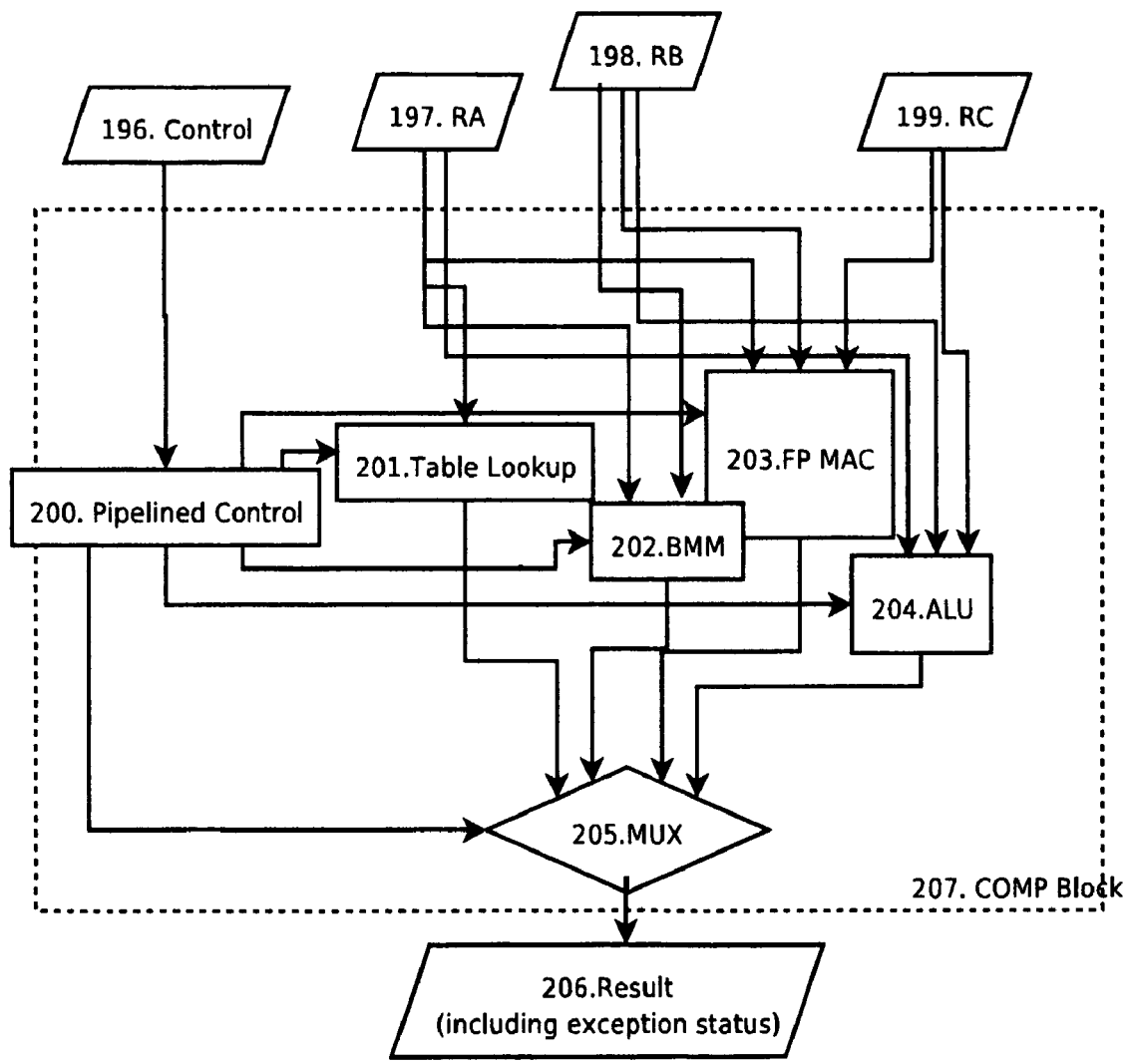
FIG. 12 illustrates selected aspects of an embodiment of computational units included in an FLane.

The computational units are shown in FIG. 12 illustrating selected aspects of an embodiment of computational units included in an FLane. The block receives up to 3 64-bit inputs from register files 197, 198, 199, and returns a 64-bit value 206 to either the register files or the DTLB. Exception status is returned to the FCTRL block. Inside the block there are three main components—a floating point MAC unit 203, a custom ALU 204, and tables used for iterative approximation computations 201. In some embodiments the pipeline depth of the COMP unit is determined by the pipeline depth of the FP MAC 203 (live cycles, for example).

MAC Unit

The MAC unit 203 in the COMP unit 207 is capable of performing 64-bit and paired 32-bit floating point multiply adds back to back at the operational clock frequency (2 GHz, for example). In some embodiments the MAC unit retains 64 bits of mantissa, is enabled to perform MULHI type integer operations, and is used for integer operations in addition to floating point operations.

Figure 13:
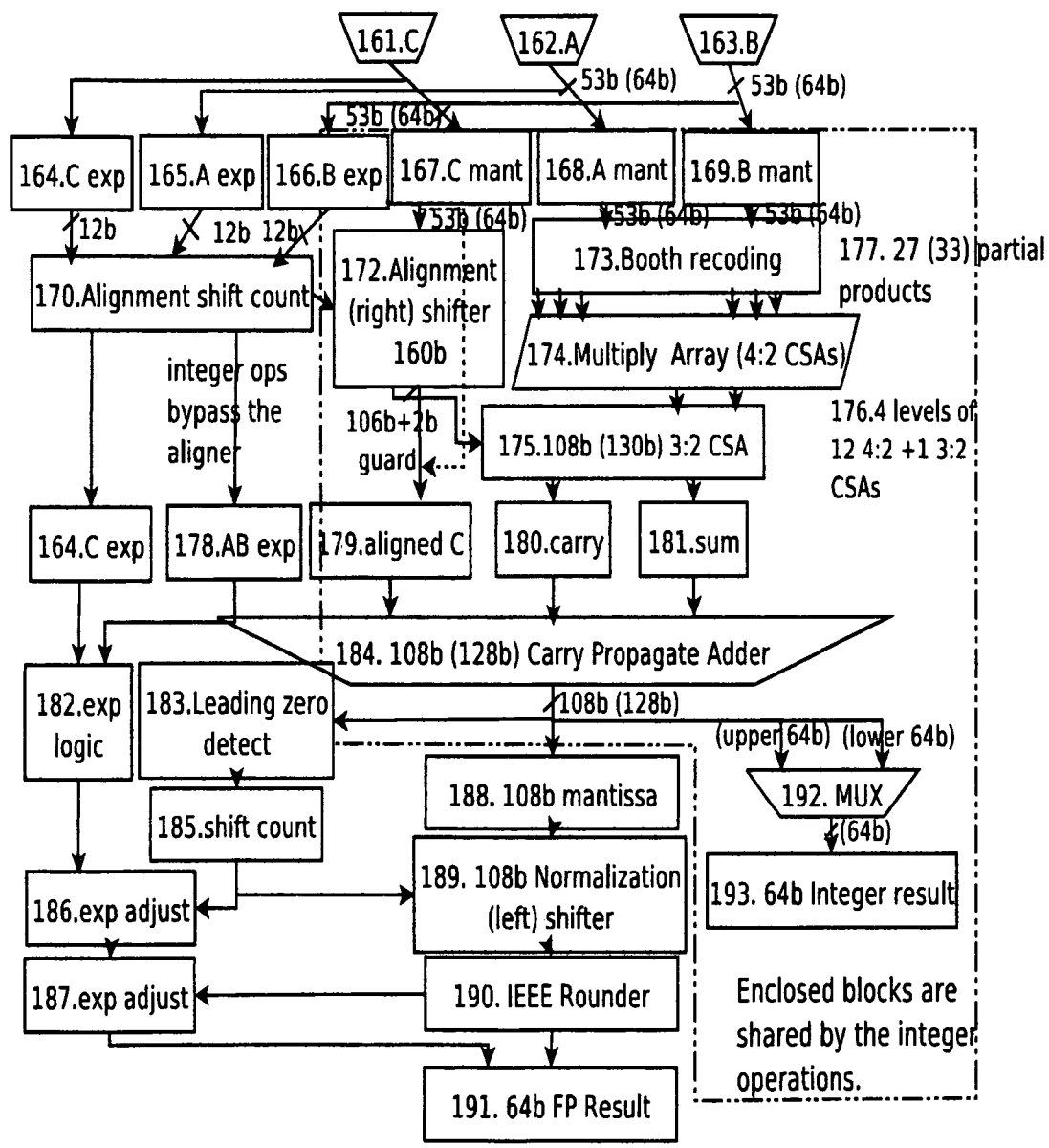
FIG. 13 illustrates selected aspects of an embodiment of a shared floating point and integer implementation of a Multiply ACcumulate (MAC) block.

FIG. 13 shows an implementation of a double precision floating point MAC. The numbers in parenthesis indicate the width of the various operands in embodiments where the hardware is also used to perform the integer multiply add operations. For example, the double precision floating point mantissa is 53-bits wide. This is 64-bits for 64-bit integers. The exponent logic is unchanged. The dashed-box enclosed blocks indicate those shared by the integer computation. The remainder are used by the floating point operations only.

ALU

In addition to typical integer addition, subtraction, and logical operations, the ALU block also supports operations such as popcount and bitreverse.

Table Lookup

In the table lookup section there are tables 201 used for providing initial lookups (or seed values) for any combination of iterative approximation functions including reciprocals, square root and trig functions, according to embodiment. In some embodiments, vectorized versions of the iterative approximation functions are provided to enable benefits of software pipelining.

Bit Matrix Multiply (BMM) Unit

The BMM unit 202 implements bit matrix multiply and bit vector dot product. The BMM unit 202 includes two 4096-bit registers (one for each vector entry in the lane) each of which includes a 64×64 bit matrix, and a network of XOR and AND gates. There are two operations that are performed in the BMM unit. A 64-bit operand may be loaded into a column of a bit matrix register (B), or a bit matrix multiply may be performed on an input A producing a 64-bit result R according to the following formula (with all operations performed under $Z_2$):

$$R_j = \sum_{i=0}^{64} A_j \cdot B_{i,j}$$

In some embodiments the BMM operation is performed by 64 parallel trees of 64 2-input AND gates feeding into a tree of XORs (for a total of approximately 8K computational gates). In other embodiments there are several pipeline stages available to perform the BMM operation, and the computation is performed iteratively using fewer computational gates.

Pipelined Control

The pipeline control logic 200 performs computational element output selection (multiplexing between outputs as necessary), interlocking relating to iterative approximation computations in embodiments where the iterative computations are implemented in hardware, and other similar pipeline control functions.

Registers

| Name | Width | R/W |
| --- | --- | --- |
| ControlInput[5] | 64 | R/W |
| LookupTables[512] | 64 | R/W |

Circuit Macros

| Name | Count |
| --- | --- |
| FP MAC | 1 |
| ALU | 1 |
| Single Ported SRAM (512 × 72) | 1 |

In some embodiments the lookup tables are implemented as single ported SRAM, and in other embodiments are implemented as Read Only Memory (ROM), with and without ECC, according to embodiment.

DTLB

The DTLB receives final logical addresses from the COMP block and translates them to physical addresses. In the case of a miss, execution in the FLane stops (this is precise within the slice). The DTLB, according to various embodiments, either signals the scalar core for a software fill, or performs a stand-alone hardware fill (similar to the ITLB).

Translated physical addresses are sent out to the MBS along with associated data in the case of stores, and with a load register identifier in the case of loads.

Registers

| Name | Width | R/W |
| --- | --- | --- |
| DTLBVaddr[16] | 64 | R/W |
| DTLBPaddr[16] | 64 | R/W |
| DTLBValid[16] | 1 | R/W |
| DTLBPageSize | 64 | R/W |
| DTLBExceptionRaised | 1 | R |
| DTLBExceptionAddr | 64 | R |

Circuit Macros

| Name | Count |
| --- | --- |
| 16 entry CAM (16 × (52 bit tag + 32 bit data)) | 1 |

Memory Buffer Switch (MBS)

Figure 14:
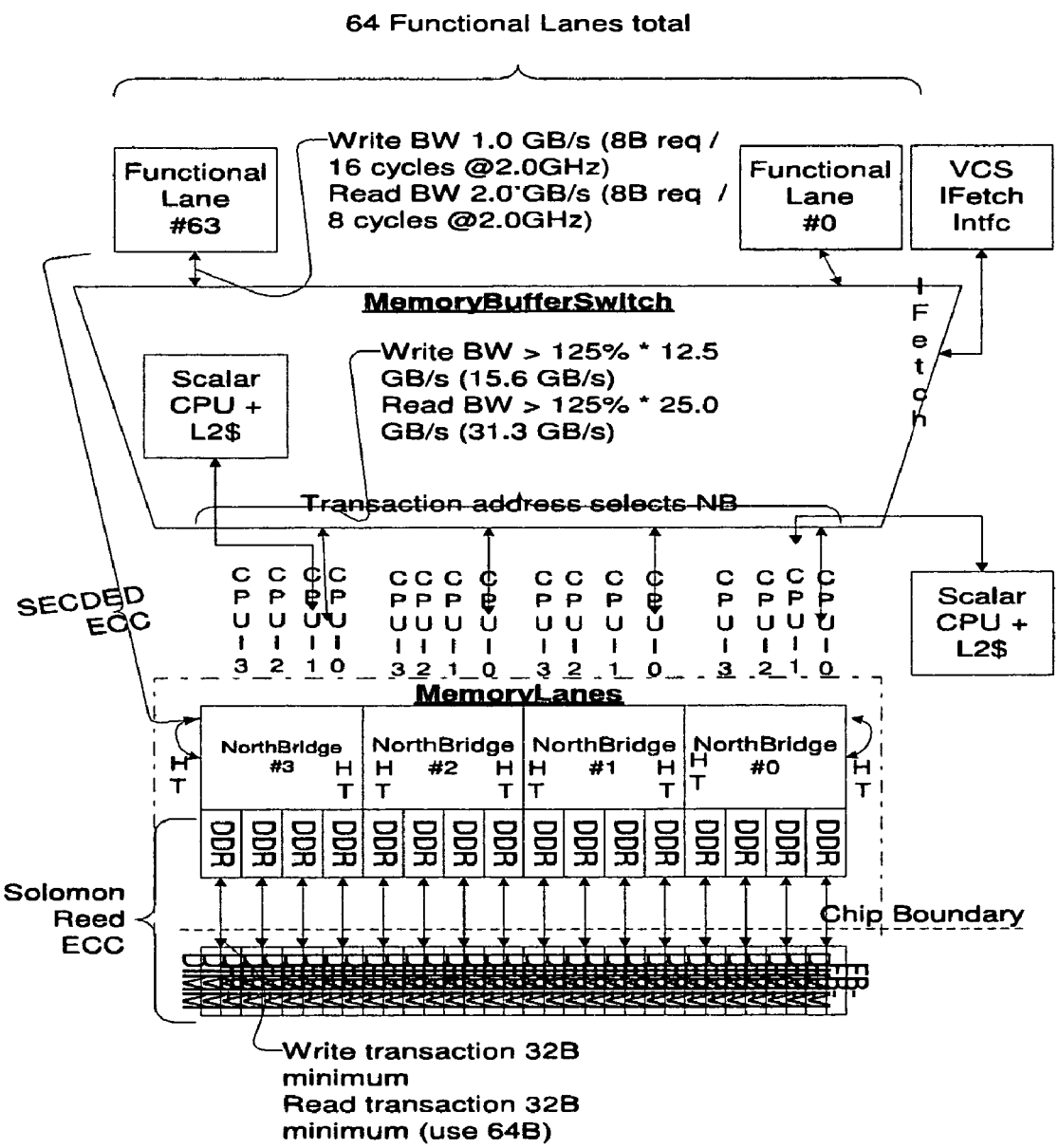
FIG. 14 illustrates selected aspects of an embodiment of a Memory Buffer Switch (MBS) in an operating context.

FIG. 14 illustrates the MBS in an operating context including the FLanes and the MLanes.

MBS 319 couples memory transaction requests (reads originating from load instructions and writes originating from store instructions) from the 64 FLanes 317 to four MLanes 326, and returns read data from the MLanes 326 to the FLanes 317. MBS also accepts instruction fetch requests from VCS 318 and returns instruction fetch data. Requests may be processed in any order, independent of the type of the request (read, write, or instruction fetch), the source of the request (which FLane 317 or VCS 318), the program order of the request (a younger reference may be processed before an older reference), and the address. For example, an FLane 317 may write a location before reading the same location (according to the program order). However, MBS 319 and (and even the MLanes) may arbitrarily reorder these operations so that the read is processed before the write. Similarly, writes to the same address may be merged, or collapsed, so that one or more of the writes are essentially ignored. Writes to overlapping addresses may be similarly processed, but it is guaranteed that all bytes of every write are processed together (i.e. either all the bytes are used or all of the bytes are overwritten by another operation). Sync instructions are used to force ordering of read and write operations originating from corresponding load and store instructions when such ordering is required.

MBS includes a blocking switch and interfaces to the FLanes 317, MLanes 324, and VCS 318. Each MLane 324 includes a Northbridge block 326. Each MBS MLane interface 324 is coupled to a CPU Interface (CPUI) port of the respective Northbridge. Each Northbridge interfaces to external DRAMs and HT/cHT links. Two Northbridges are interfaced to two scalar processors 320, 322 (via CPUI ports), and one Northbridge 326 provides a port to interface to vector processor registers, as described elsewhere herein.

In some embodiments the vector processor is provided absolute priority over the scalar processor (or processors) for Northbridge resources (such as request bandwidth). In other embodiments the scalar processors are provided higher priority to Northbridge resources than the vector processor. In still other embodiments the priority between the scalar and vector processors is dynamic, dependent on requests outstanding (according to absolute number, relative age, and other similar criteria).

The DRAM physical address space is contiguous. Within this address space, bits 9 and 8 select one of four MLanes 324, bits 7 and 6 select one of four DDR channels 329, and the least significant six bits select a byte within a 64 B chunk (typically corresponding to a scalar core cache line). More significant address bits (bit 10 and up) address rows and columns within the DRAMs: row&column[max:10] DDR_Channel[9:8] Memory_Lane[7:6]. MBS examines the address of each request in order to route the request to the proper MLane (except that instruction fetches are broadcasted to all MLanes and conditionally accepted based on address).

Furthermore, the HT/cHT links and the VCRs are also arranged in a contiguous section of physical addresses.

The figure illustrates major data flows provided by MBS and the MLanes, including the coupling of each Northbridge to four DDR FB-DIMM channels 329. Each channel may be populated by two DIMMs. In some embodiments the total peak bandwidth available from the 16 FB-DIMM channels is approximately 63 GB/s write and 125 GB/s read. This provides each of the 64 FLanes with an average of one 8 B write per 16 cycles and one 8 B read per 8 cycles (@2 GHz), ignoring VCS instruction fetches and scalar core references.

Since the FB-DIMM channels and associated DRAMs are organized for burst transfers (32 B minimum), MBS 319 attempts to combine data read and write requests from the FLanes into larger chunks before presenting the requests to the MLanes 324 (no combining is performed for instruction fetch requests, as 64 B is the fetch size). Reads (data and instruction fetch) are performed in 64 B chunks, and returning read data chunks are conceptually broadcast to all FLanes 317, and each lane is responsible for capturing read data it requires.

Even though on average each FLane 317 generates only one read every 8 cycles (and one write every 16 cycles), the requests may be generated in bursts. For example, every FLane 317 may simultaneously generate a request for an indeterminate number of contiguous cycles. Therefore MBS 319 is enabled to receive a request from every FLane 317 on every cycle (a total of 64 requests per clock). A credit system is used to prevent overrun of buffering in MBS 319. Read and write references from the FLanes 317 are of sizes 1 B, 2 B, 4 B, and 8 B, and are always naturally aligned.

Generally reads are given priority over writes, unless there is no more room to buffer further writes. Writes are combined up to a maximum of 32 contiguous bytes before presentation to the MLanes 324. The MLanes 324 perform reads in bursts of 64 B, and each read return is broadcast to all FLanes 317, or more specifically broadcast to a set of 64 FLane 317 interfaces in MBS 319. Each such interface is coupled to a respective FLane 317, and load return data is provided to FLanes 317 for writing into the appropriate location in the CRF. Data is returned to the FLane 317 aligned to the least significant bytes, depending on the size of the reference (1, 2, 4, or 8 bytes), along with a register identifier. There is a credit based flow control on this interface. In some embodiments relative priority of reads and writes is adjusted on a dynamic basis, according to criteria including number of outstanding transactions, age of the oldest outstanding transaction, and other similar information, according to embodiment.

A single read return from an MLane 324 may satisfy only a single 1 B request in a single FLane, or the single return may satisfy several 8 B requests from each of several FLanes, or any of a variety of other scenarios. It is even possible for a single return to satisfy several requests for exactly the same data, when the requests originate from a single FLane, or when the requests originate from several FLanes. MBS 319 attempts to buffer read return data in order to allow the data to be applied to satisfy as many read requests as possible. Read return data may be buffered indefinitely, even if written by store instructions. However, a sync instruction invalidates all buffered data with respect to load instructions that follow the sync instruction. Instruction fetch data is buffered only transiently, being discarded immediately after successful delivery to VCS 318, as it typically matches only a single outstanding request (except for the unlikely scenario of instruction bytes being fetched as data bytes). In various embodiments read data is held indefinitely (as described above), discarded according to a least recently used first scheme, discarded when the instruction sourcing the oldest request for the data is completed, and via other similar mechanisms, according to embodiment.

Not shown in the figure are couplings for additional spare (or redundant) FLanes 317 included to increase yield, according to various embodiments. The spare FLanes 317 and associated couplings are identical to those illustrated. Up to four spare FLanes 317 are supported, so that there are a total of 68 FLane 317 couplings, only 64 of which are enabled to provide requests and receive data at any given time. In some embodiments the 64 enabled FLanes 317 are identified by register state loaded by the scalar core (typically after accessing information describing which FLanes 317 are operational for the given instance of the vector processor). In some embodiments the register state is loaded in response to a power-on self-test sequence performed by the vector processor. In other embodiments the register state is loaded in response to test sequencing carried out under the control of the scalar core.

Figure 15:
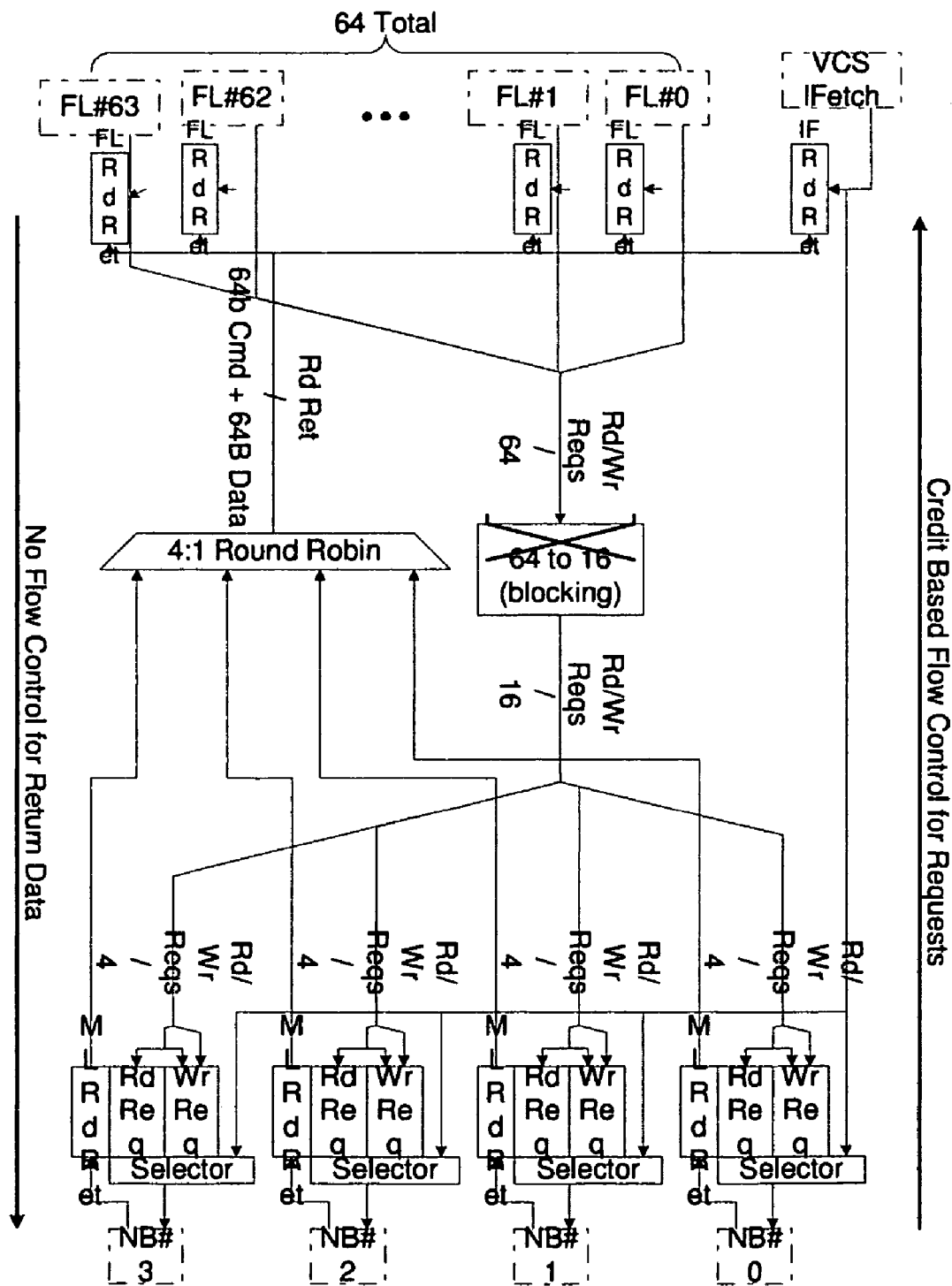
FIG. 15 illustrates selected top-level aspects of an embodiment of the MBS.

FIG. 15 illustrates the top-level of the MBS 319 block in the context of the FLanes 317 and the MLanes 324. Memory transaction requests (reads and writes) are received from the 64 FLanes 509, up to 64 per cycle, and applied to a 64 to 16 blocking switch 516, using a credit based flow control scheme. Each cycle 16 requests 517 are passed by the switch to the four MLanes, with each lane receiving four requests in parallel 518. The switching function is controlled by the transaction address, as described above. Additional couplings for spare FLanes are not shown, but four extra interfaces are supported, and the 64 to 16 switch implements a 68-to-16 functionality.

Read and write requests are subsequently processed separately in the RdReq 520 and WrReq 521 blocks respectively. The processing includes comparing each arriving request with previously received and in progress requests, coalescing contiguous and duplicate requests when possible. Reads are coalesced according to 64 B naturally aligned boundaries. Writes are coalesced according to 32B naturally aligned boundaries, with newly arriving data overwriting previously received data that has not yet been communicated to the Northbridge. Each cycle a single request, either a read or a write, is selected within each MLane for application to the included Northbridge.

Read return data is provided by each Northbridge at a rate of 16 B per cycle, and this data is buffered (in four clocks) to a 64 B chunk by the MLRdRet block 519 before communication to a 4:1 round robin block 515 coupled to all four MLanes. Each cycle the round robin block broadcasts a selected one of the four 64 B chunk read returns for use by all FLanes (including the spares), averaging one 64 B chunk per MLane per four clocks. An interface block (FLRdRet 512) per FLane (and per spare FLane) then buffers and processes the broadcasted read return data 513 into individual register file write transactions that are then communicated to the associated FLane. Read requests are logged into FLRdRet 512 upon presentation from the FLane to MBS, and a credit based flow control is used in the request path to guarantee that no flow control is needed for the returning data path.

A single interface block (IFRdRet 512) buffers and processes the broadcasted read return data into instruction fetch return transactions that are then communicated to VCS 510. Instruction fetch request are logged into IFRdRet upon presentation from VCS to MBS, and a credit based flow control is used in the request path to guarantee that no flow control is needed for the returning data path.

Figure 16:
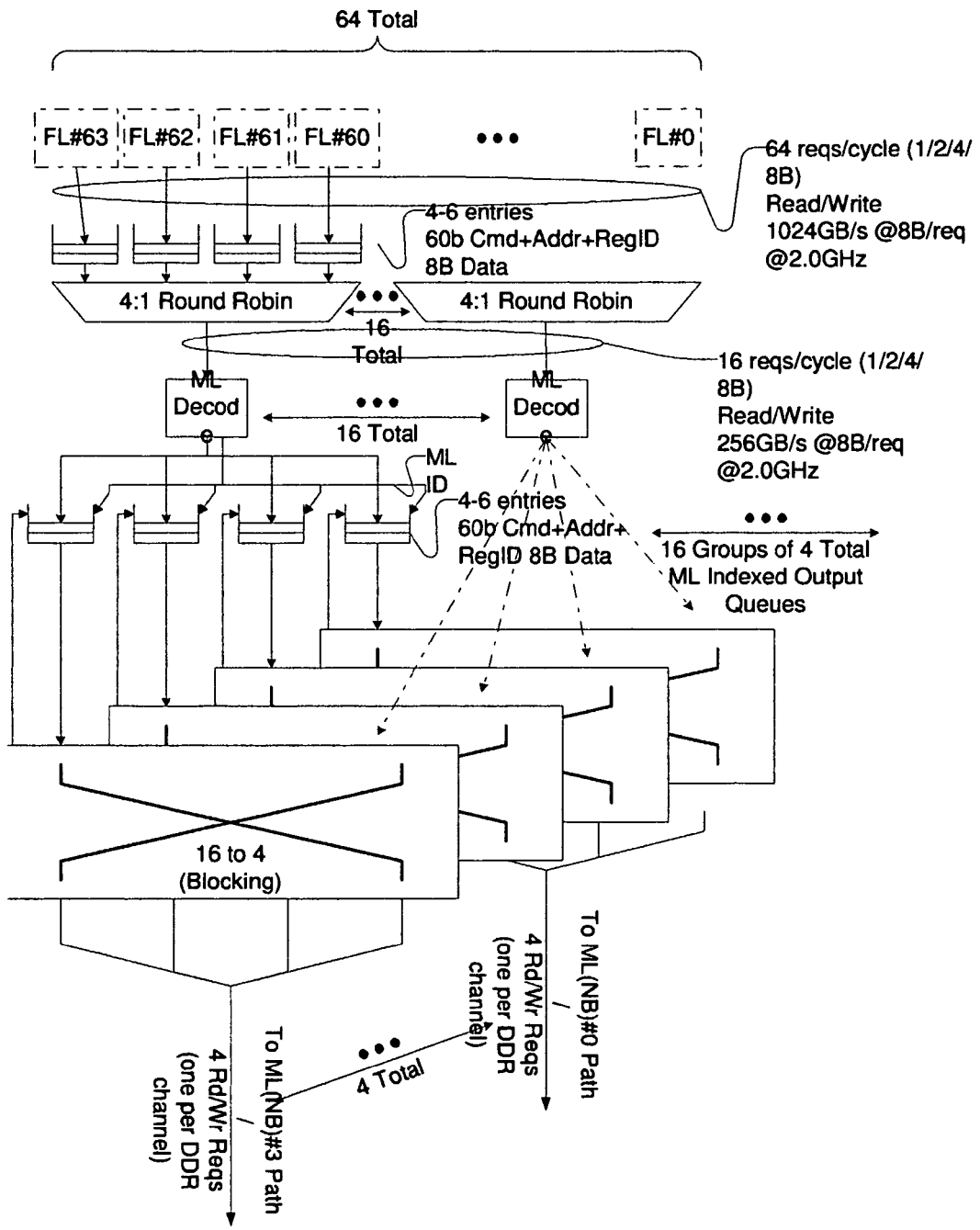
FIG. 16 illustrates selected aspects of an embodiment of an MBS 64×16 switch.

FIG. 16 illustrates the 64 to 16 blocking switch that routes up to 16 requests per cycle from the 64 FLanes to the four MLanes. Requests of 1, 2, 4, or 8 bytes are accepted from the FLanes 314 according to a credit based flow control, with each FLane managed separately. Since all 64 FLanes may generate one request per cycle, the total request burst bandwidth is 1024 GB/s (for 8 B requests @2 GHz). Input request queues 312 of four to six entries (according to embodiment) per FLane buffer 60 bits of command, address, and register identifier information per entry (reads and writes), and up to 8 bytes of data for writes. The register identifier field is not used for writes.

The input request queues 312 are followed by 16 total 4:1 round robin blocks 310, each selecting one request per cycle to pass toward the MLanes, totaling sixteen requests per cycle. This corresponds to one quarter of the input rate, or 256 GB/s (for 8 B requests @2 GHz). The round robin blocks 310 are each coupled to logically adjacent FLanes 314, i.e. the most significant round robin block is coupled to FLanes 63 to 60, the next most significant to FLanes 59 to 56, and so forth to the least significant being coupled to FLanes 3 to 0. In some embodiments logically adjacent FLanes are also physically adjacent, while in other embodiments logically adjacent FLanes are not physically adjacent, and the round robin connectivity is based on physical adjacency instead of logical adjacency.

As mentioned previously, the 64 to 16 switch is really a 68-to-16 switch, and includes four additional ports (not shown) for spare FLanes. Support for the additional ports is provided by replacing four of the 4:1 round robin blocks with corresponding 5:1 round robin blocks, with the additional input of each of the 5:1 round robin blocks coupled to one of the spare ports via an input request queue identical to the other FLanes. Downstream from the 4:1 and 5:1 round robin blocks, support for the spare ports is transparent.

The outputs of the round robin blocks 310 are decoded in parallel by 16 ML Decode blocks 315 to determine the destination MLane (based on physical address bits 9 and 8). The results are then buffered in output queues organized by destination MLane. As there are 16 round robin blocks, each followed by four output queues, there are a total of 64 output queues, corresponding to 16 queues for each of the four MLanes. The output queues are of the same size and general organization as the input queues, except that the output queues are selectively read based on a match between a desired DDR channel identifier (provided by the following 16 to 4 switches) and physical address information (bits 7 and 6) stored in the output queues.

The 64 output queues are coupled to a group of four 16 to 4 switches, according to the MLane associated with each respective output queue, and each switch is coupled to an associated MLane. Every cycle each 16 to 4 switch accepts up to four requests from the set of 16 output queues the respective switch is coupled to, and passes the four accepted requests toward the associated MLane. The requests are accepted based on a round robin mechanism within the 16 to 4 switch selecting between each of the four DRAM channels in the respective MLane.

Figure 17:
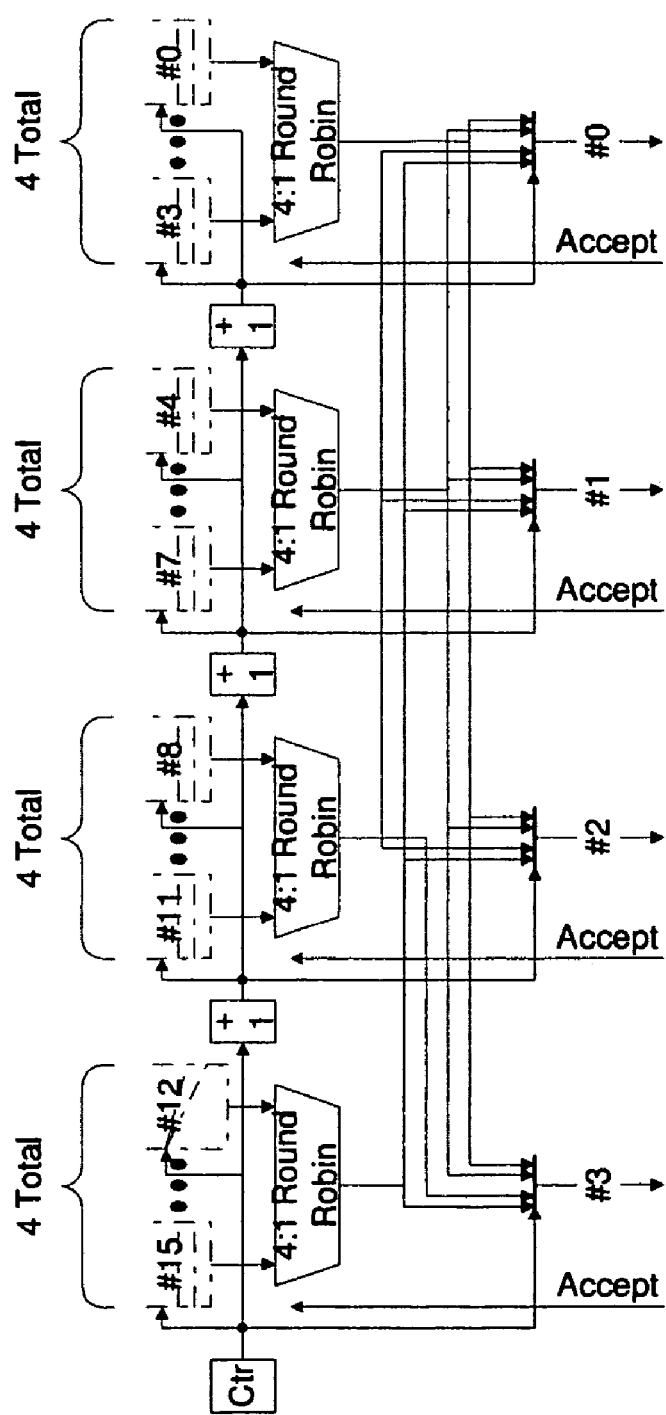
FIG. 17 illustrates selected aspects of an embodiment of an MBS 16×4 switch.

FIG. 17 illustrates one of the 16 to 4 switches. The 16 inputs are arranged in four groups of four 300, with each group being coupled to a 4:1 round robin selector 301. A counter value provided by the Ctr block increments through the four DDR channels, one per clock, so that on any given clock a request for each of the four channels is coupled to one of the four switch outputs. For example, on a first cycle, output #3 would provide a request for DDR channel 0 (from one of inputs #15 to #12), while output #2 would provide a request for DDR channel 1 (from one of inputs #11 to #8), and so forth. On the next cycle, output #3 would provide a request for DDR channel 1, output #2 for DDR channel 2, and so forth. In this manner the switch moves up to four requests per cycle toward the associated MLane. An Accept indication 302 is provided from the switch to the selected output queue, so that the request may be removed from the queue.

Figure 18:
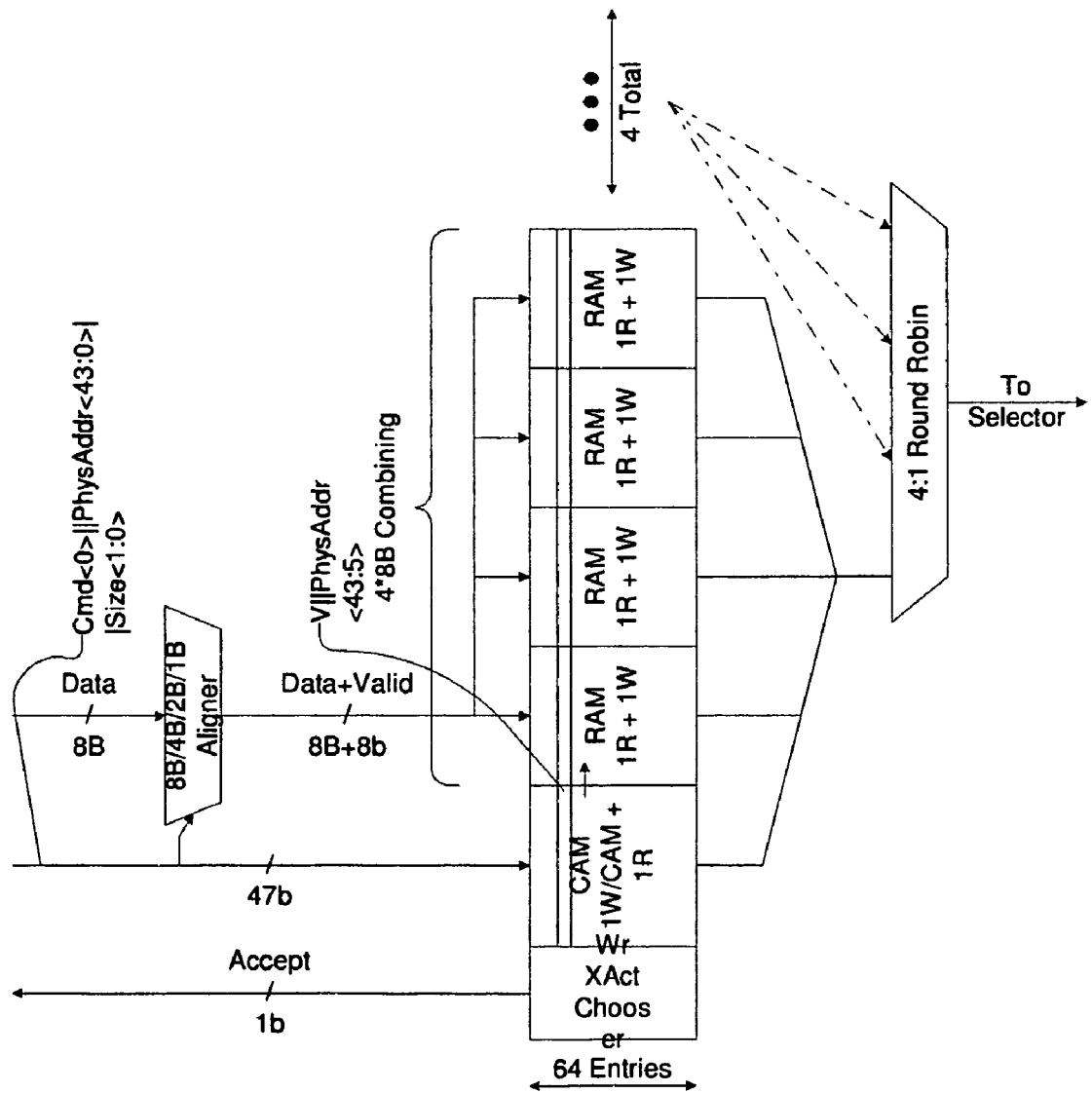
FIG. 18 illustrates selected aspects of an embodiment of an MBS write request path block.

FIG. 18 illustrates an instance of the WrReq block that processes write requests, up to four per clock (one for each DDR channel), received from one of the 16 to 4 switches. A 64-entry CAM and RAM block, coupled to a Chooser, manages write requests for a single DDR channel. A total of four of these CAM/RAM/Chooser units are included in each WrReq block, corresponding to one per DDR channel. The four units are coupled to a 4:1 round robin block that selectively passes a single one of the requests to the following selector block that chooses between a read request, an instruction fetch request, and the selected write request for presentation to the associated MLane.

Each entry includes a 47-bit wide CAM section retaining and comparing the upper bits of the physical address, and four parallel 8 B chunk RAMs managed as a contiguous 32 B naturally aligned chunk suitable for a burst transaction on a DDR channel. Write data (1, 2, 4, or 8 bytes) is aligned or passed unchanged according to the lower portion of the physical address, and stored into the appropriate one of four 8 B chunk storage RAMs, based on the physical address, effectively coalescing multiple requests into a single MLane operation.

Figure 19:
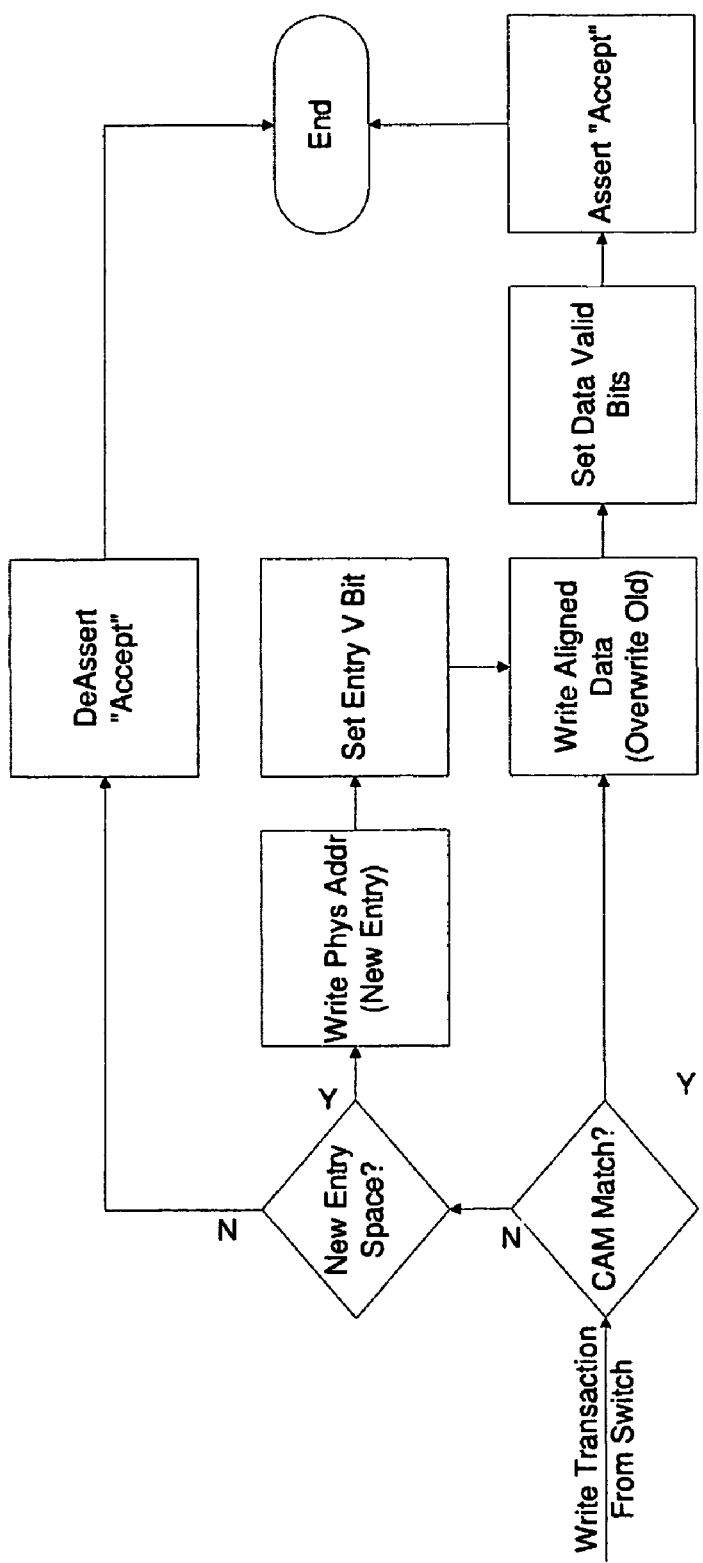
FIG. 19 illustrates a flow diagram of selected operating aspects of an embodiment of MBS write request enqueuing.

FIG. 19 illustrates enqueuing of a write transaction received from the preceding switch for subsequent coalescing and eventual transmission to the associated MLane. When a write transaction is received from the switch, the address is applied to the CAM field 532. If there is a match, then the new data is coalesced with previously received data. The aligned data is written into the proper RAM block 533 of the matching entry, and the associated data valid bits are set 528. Note that previously written data may be overwritten by new data before the previous data is sent to the MLane. Acceptance of the transaction 527 is signaled back to the switch.

If there is no match, then a new entry is required if the transaction is to be accepted. If there is no space then the request is not accepted. If there is space then the physical address 529 is written to a free entry and the associated valid bit is set. Subsequently the aligned data is written, valid bits are set, and the transaction is accepted, as in the CAM match case. In some embodiments a free entry is always kept available, and it is written with each received transaction address, irrespective of whether the CAM matches, but the assertion of the new entry valid bit and selection of a next free entry is delayed until the CAM match is known.

Figure 20:
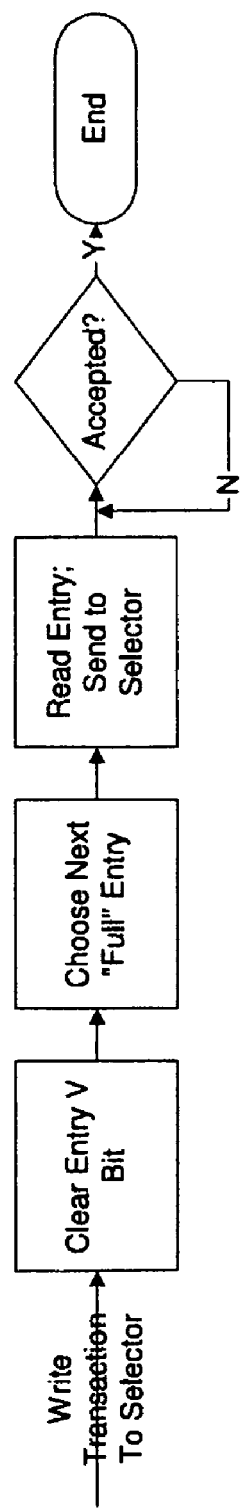
FIG. 20 illustrates a flow diagram of selected operating aspects of an embodiment of MBS write request dequeuing.

FIG. 20 illustrates dequeuing an entry as selected by the Chooser for presentation to the selector. When a write transaction 544 entry has been accepted by the selector, then the valid bit of the corresponding entry is cleared, freeing the entry for subsequent use. Then the next entry is chosen for presentation to the selector (note: in typical implementations this occurs in parallel with other processing). The chosen entry is read (address and command information from the CAM, and data information from the four RAMs), and the information sent to the selector, awaiting acceptance. Priority in selecting the next entry to send to the selector is given to entries that are full (i.e. all 32 bytes of data in the entry are valid), or are most nearly full.

Figure 21:
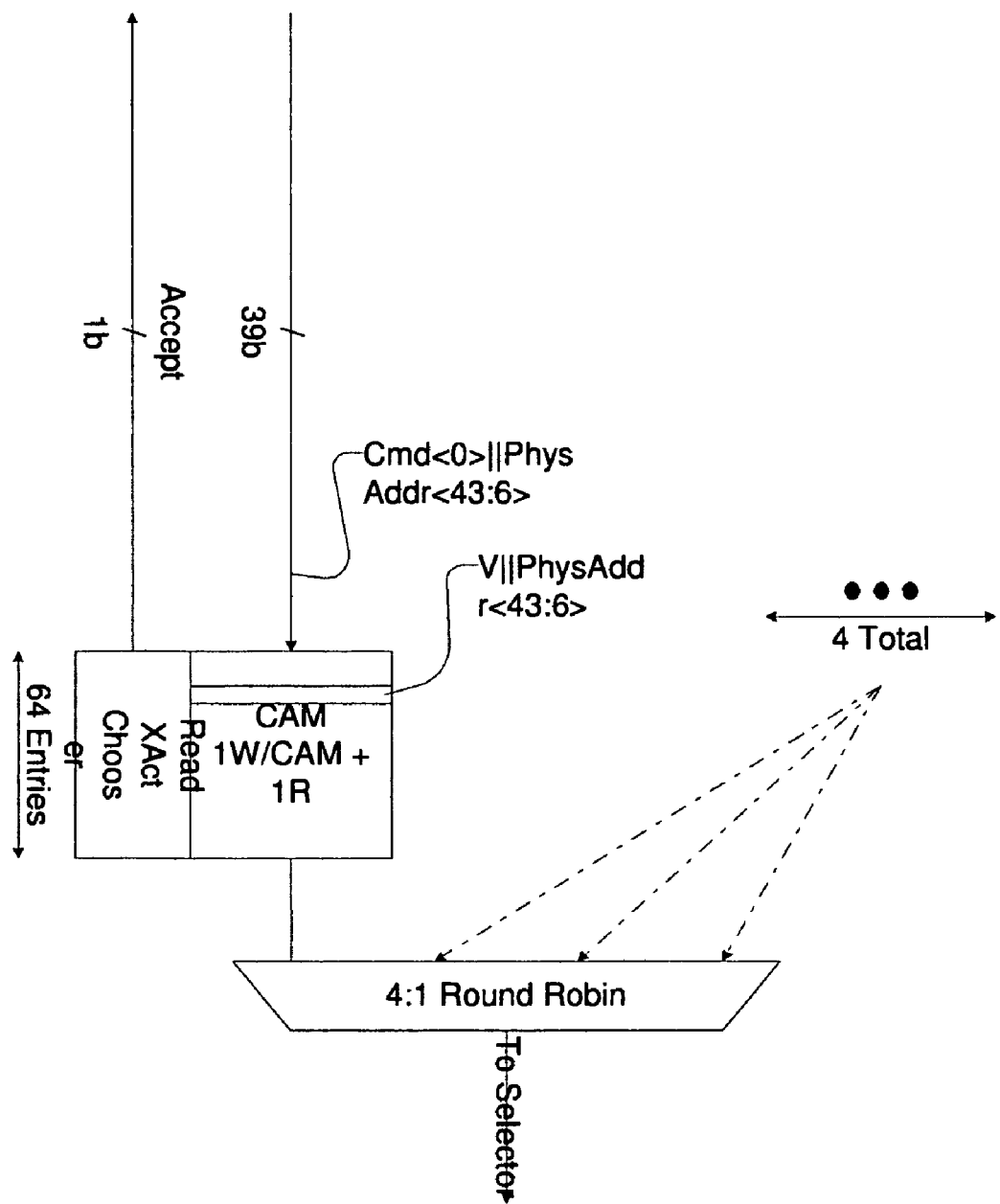
FIG. 21 illustrates selected aspects of an embodiment of an MBS read request path block.

FIG. 21 illustrates an instance of the RdReq block that processes read requests, up to four per clock (one for each DDR channel), received from one of the 16 to 4 switches. The organization and operation is similar to that of the WrReq block, except that no data is received or stored, only command and address information, and coalescing is performed with respect to 64 B naturally aligned chunks. As in the WrReq case, there are four CAM/Chooser units coupled to a 4:1 round robin block that couples one of the four chosen requests to the following selector.

Figure 22:
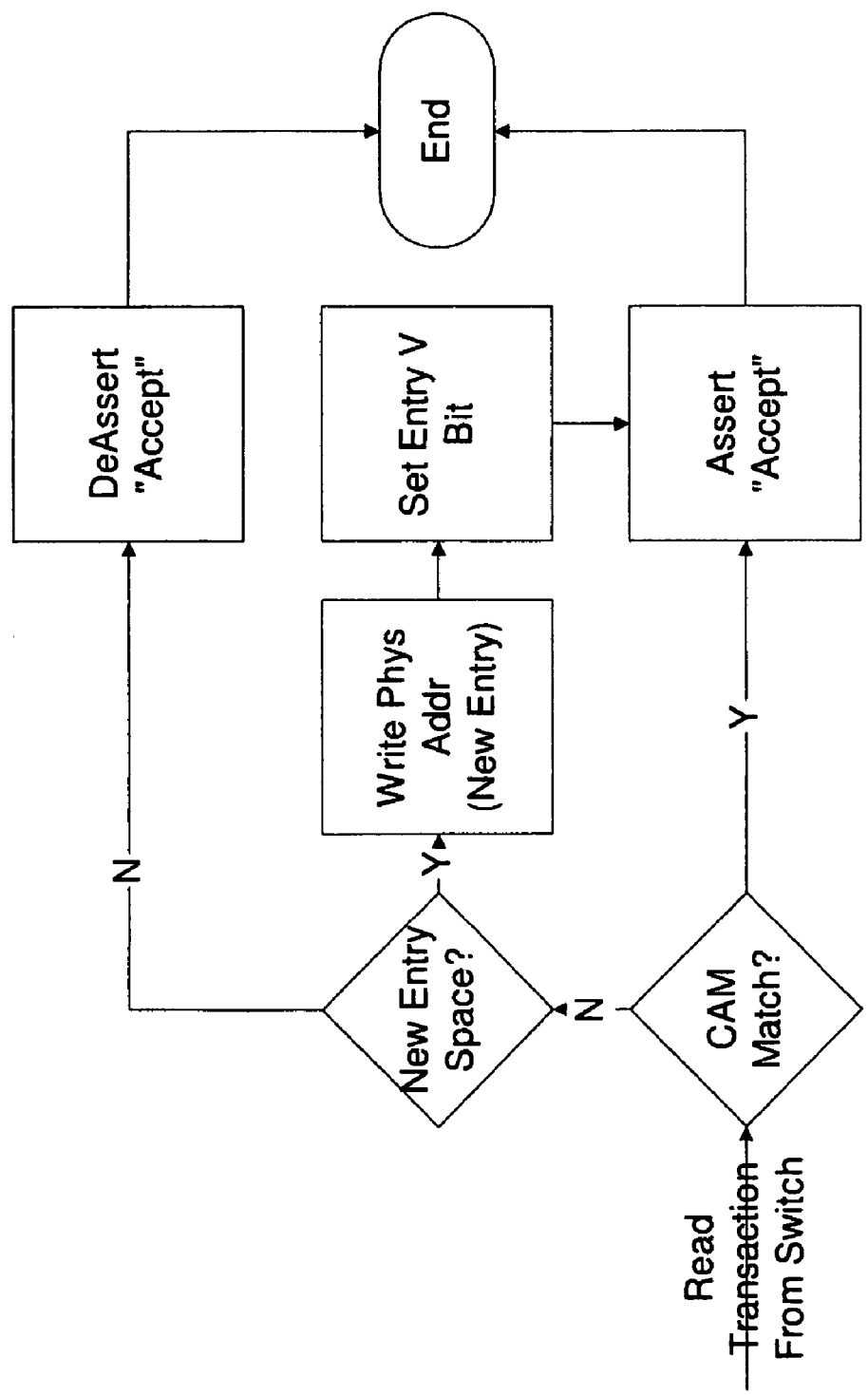
FIG. 22 illustrates a flow diagram of selected operating aspects of an embodiment of MBS read request path enqueuing.

FIG. 22 illustrates enqueuing a read transaction received from the preceding switch, and the operation is similar to the WrReq block enqueuing operation, except that there is no processing of received data.

Figure 23:
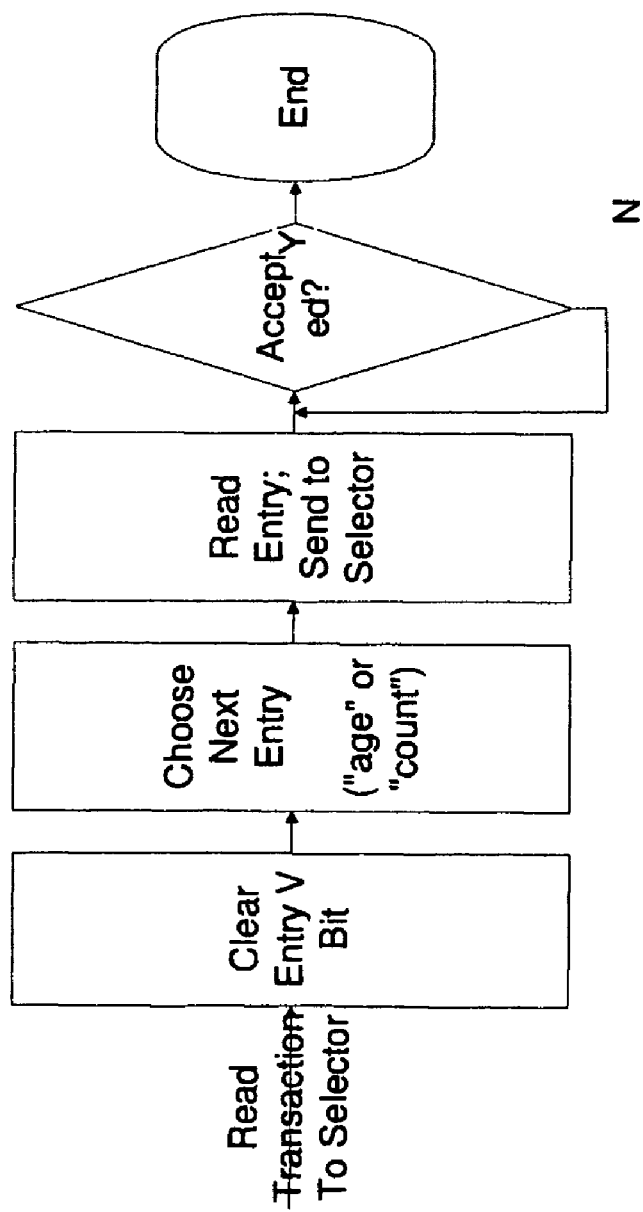
FIG. 23 illustrates a flow diagram of selected operating aspects of an embodiment of MBS read request path dequeuing.

FIG. 23 illustrates dequeuing a chosen entry that has been accepted by the selector. The operation is somewhat similar to the WrReq block dequeuing operation, except that the Chooser prioritizes based on relative age, picking the oldest outstanding entry. In some embodiments the Chooser prioritizes based on coalesced transaction count information associated with each entry. In some embodiments the coalescing window is extended by delaying the clearing of the valid bit until the entry has been accepted by the selector, or until there is a response to the request from the MLane, according to various embodiments.

Figure 24:
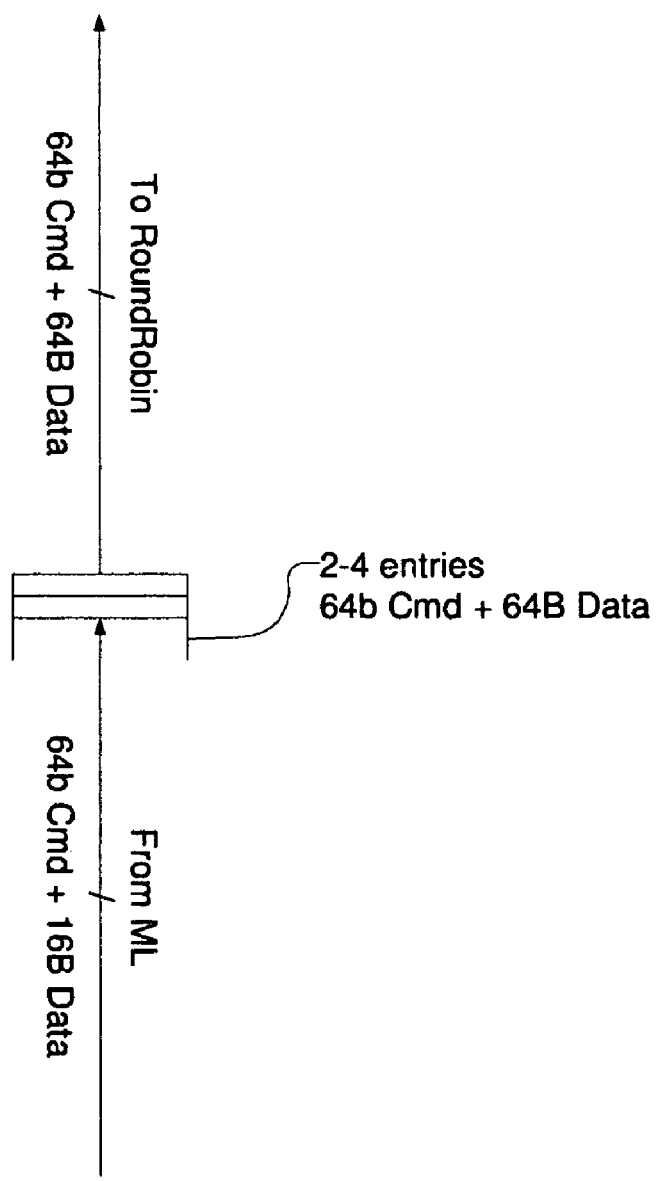
FIG. 24 illustrates selected aspects of an embodiment of an MBS Memory Lane (MLane) read return path block.

FIG. 24 illustrates an instance of the MLRdRet block that gathers read return information, supplied in 16 B chunks by the MLane, and collects it into 64 B chunks of naturally aligned contiguous data A queue of two to four entries 390 (according to embodiment) is used to buffer the returning data, with each entry including 64 bits of command and address information, and up to 64 B of read return data. The 16 B return data chunk is aligned to the proper slot in the 64 B read return data image as it is written into the queue. Full entries are read out (address, command, and 64 B of data) and supplied to the 4:1 round robin block that alternates between the four MLanes to broadcast read return data to all FLanes and VCS.

Figure 25:
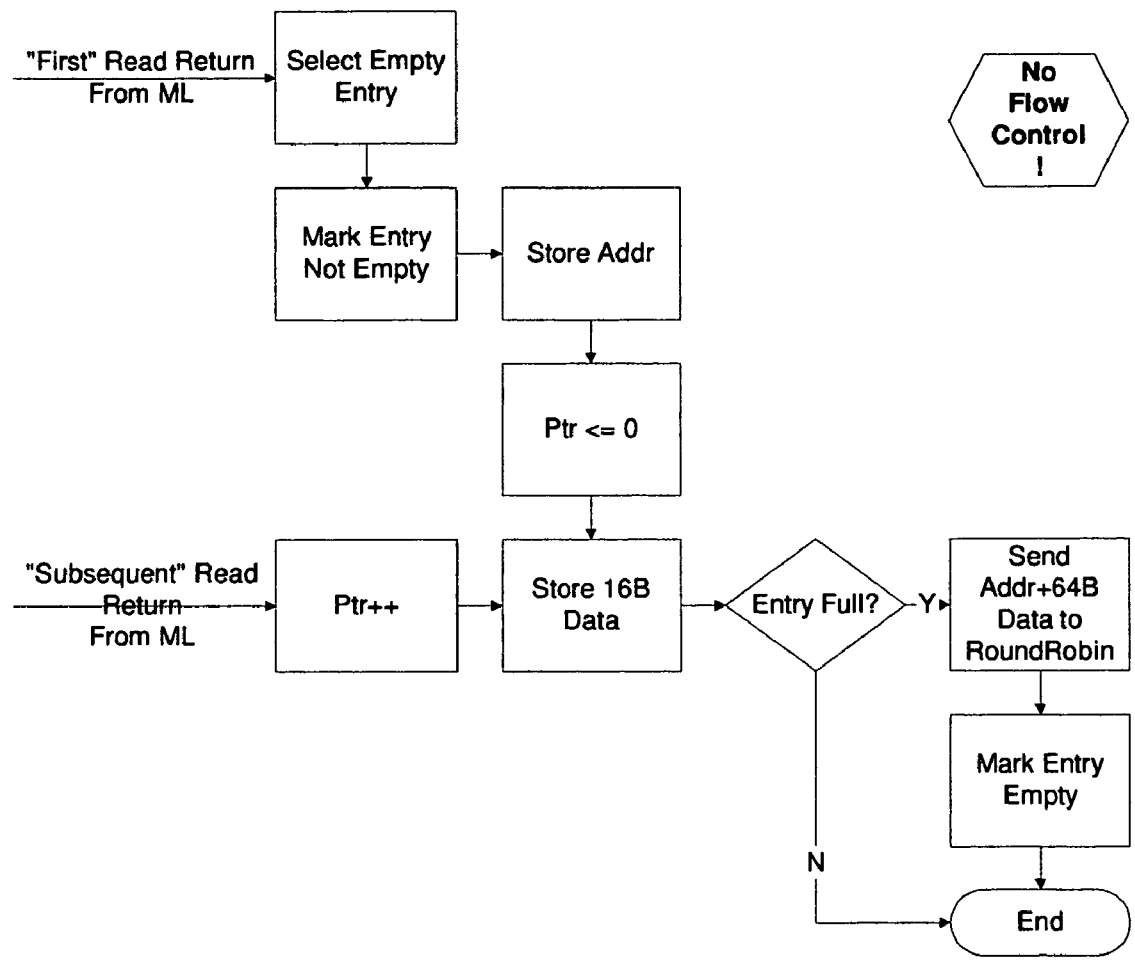
FIG. 25 illustrates a flow diagram of selected operating aspects of an embodiment of an MBS MLane read return path operation.

FIG. 25 illustrates the operation of the RdRet block. When the first chunk of 16 B read return data is received from the MLane, the address and data are stored into a selected empty entry, and the entry is marked as in use. As subsequent read returns are received, they are written into the selected entry until the entry is full (four 16 B returns total). The entry is then sent (address and data) to the 4:1 round robin and marked empty.

Note that there is no flow control in the returning read data path. Read requests are not accepted by MBS unless there is guaranteed to be room in the RdRet path for the eventual returning data. As four cycles are needed for the MLane to provide the entire 64 B chunk that is broadcast to the FLanes and VCS, and the 4:1 round robin selects from each of the four MLanes once every four cycles, the input and output rates match.

Figure 26:
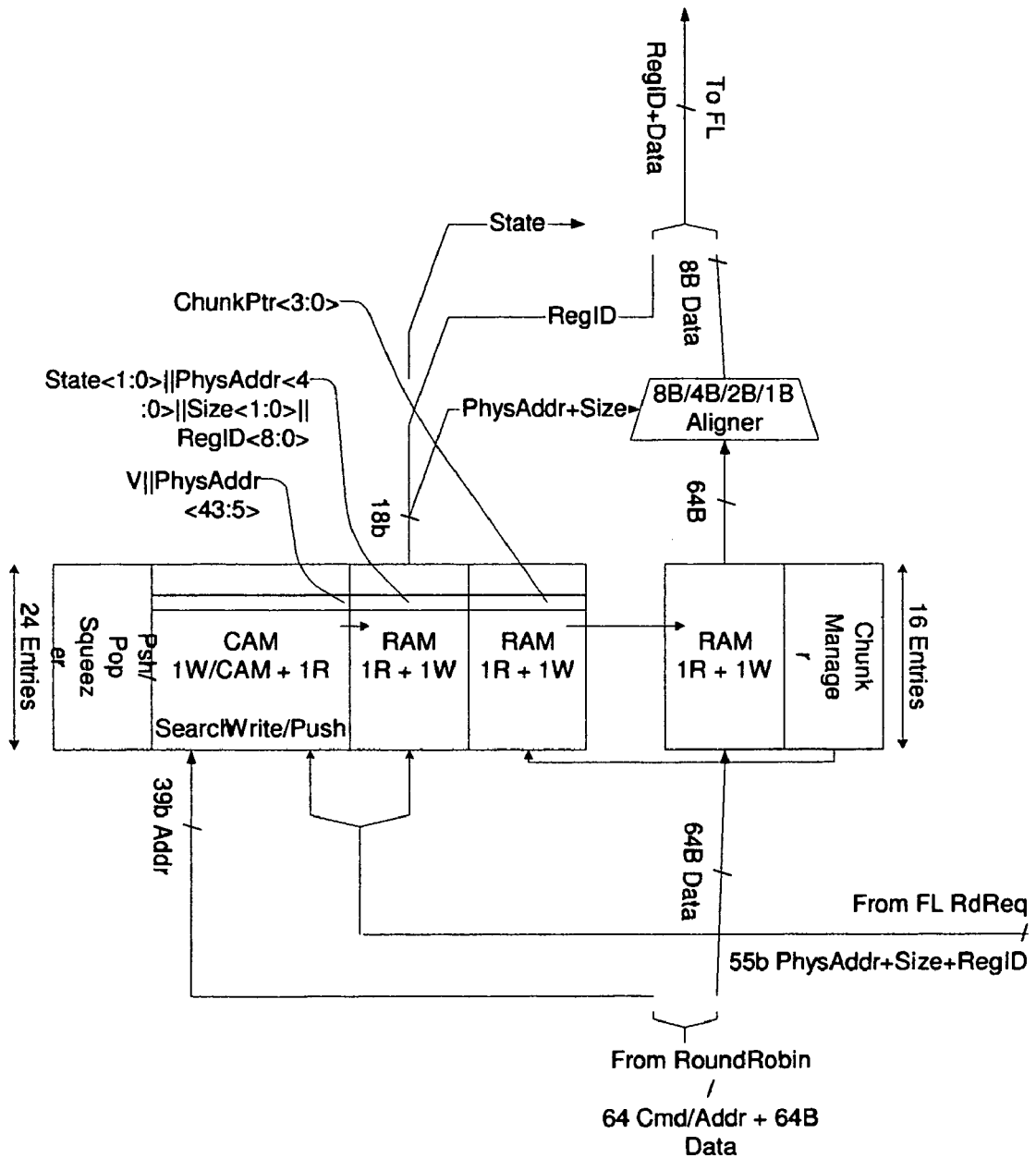
FIG. 26 illustrates selected aspects of an embodiment of an MBS FLane read return path.

FIG. 26 illustrates an instance of the FLRdRet interface block that processes read returns (as broadcast by the 4:1 round robin) into individual register file write transactions for delivery to the associated FLane. There is one FLRdRet block per FLane, and each block independently absorbs the broadcast data and matches it up to any outstanding read requests for the associated FLane that may be satisfied by the broadcast data. As multiple requests may be satisfied by a single 64 B broadcast chunk, a control mechanism sequences through the matching requests to provide one register file write transaction per clock until all of the matching entries have been processed.

A 24-entry CAM 337 and RAM 338 block, coupled to a Push/Pop Squeezer 336, manages read requests from initial acceptance from the FLane through successful read data return. Each entry includes a 38-bit wide CAM 337 to match 64 B naturally aligned addresses. A first RAM portion of each entry 338 includes the least significant portion of the physical address, the reference size, and a 9-bit register identifier field that describes the target register of the load instruction the memory read transaction originated from. Conceptually associated with the first RAM portion 338 is a 2-bit state field per entry that is implemented outside of the RAM 338 to allow simultaneous access to the state associated with each entry. A second RAM portion 338 of each entry stores a pointer to the returned 64 B data chunk. A separate 16-entry RAM block, coupled to a chunk manager 339, stores the returned 64 B data chunks. The chunk storage RAM output is coupled to a data aligner that selects the appropriate sized data window of the chunk (1, 2, 4, or 8 bytes) and aligns the selected data to the least significant bits.

Figure 27:
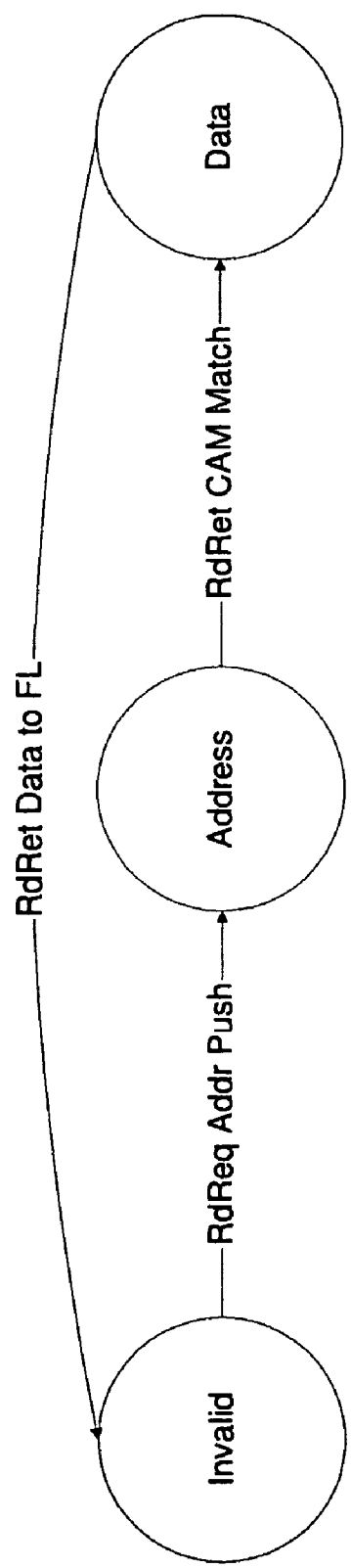
FIG. 27 illustrates an embodiment of MBS FLane read return path states.

FIG. 27 illustrates state transitions associated with each entry of the CAM/RAM/Squeezer unit. An Invalid entry transitions to the Address state when a read request address is pushed into the entry. When the address associated with a 64 B chunk of returning read data is found to match the entry, then the entry transitions to the Data state. When the entry has been processed into a register file write transaction delivered to the FLane, then the entry transitions back to the Invalid state, awaiting a new use as a push target.

The state machines for all of the entries are managed concurrently, as a single returning chunk may simultaneously match any number of entries (from zero to all of the entries) in the CAM/RAM/Squeezer unit. However, only a single entry makes the transition from the Invalid to the Address state at a time, as only a single read request is received from an FLane at a time. Similarly, only a single entry makes the transition from the Data to the Invalid state at a time, as only a single register file write transaction may be delivered to an FLane at a time.

Figure 28:
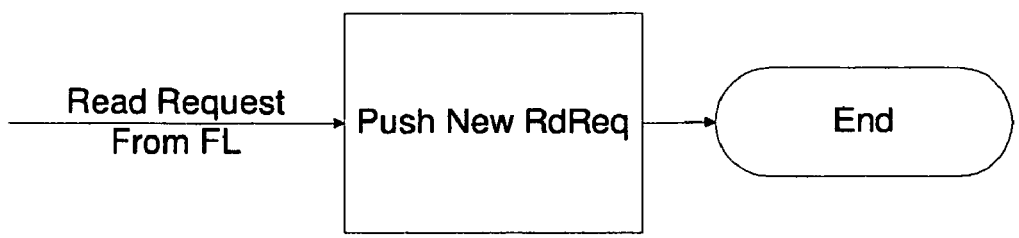
FIG. 28 illustrates a flow diagram of selected operating aspects of an embodiment of an MBS FLane read return path request push.

FIG. 28 illustrates a read request push operation. A credit based flow control mechanism handshakes read requests as they are logged into the push/write port of the CAM/RAM/Squeezer unit from the FLane. The credit flow control accounts for space in the RAM/CAM/Squeezer unit and also accounts for space in the 64 B chunk RAM. The upper portion of the address of the transaction is stored in the next available free entry (in the CAM section) for subsequent matching against the address associated with returning 64 B chunk data The lower portion of the address, the size of the reference, and the register target of the load instruction originating the request are stored in the RAM section of the free entry.

Figure 29:
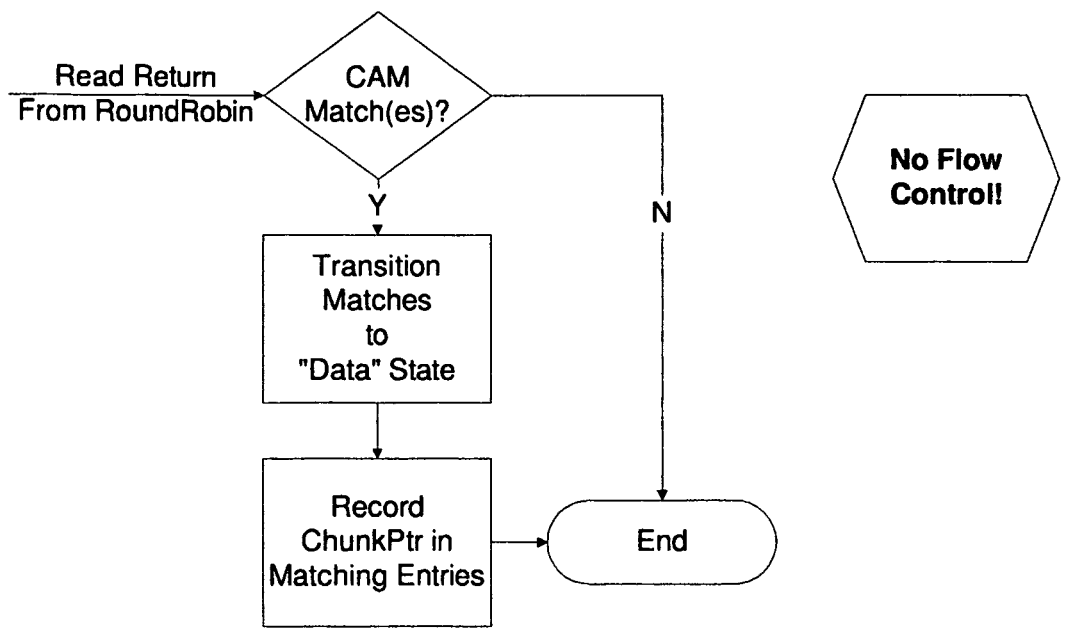
FIG. 29 illustrates a flow diagram of selected operating aspects of an embodiment of MBS FLane read return path processing including address matching.

FIG. 29 illustrates processing of a broadcast 64 B returning read data chunk. The address is compared by the CAM section to the addresses of all of the outstanding read requests (i.e. entries in the Address state). All matching entries transition to the Data state, indicating that data for the read request is now available to provide to the FLane for a register file write. The matching entries also receive a pointer to a location in the 64 B chunk RAM that receives the returning read data chunk. Note: there is no flow control in this processing, i.e. the CAM is able to accept a new comparison address every cycle. In some embodiments the chunk pointer RAM is implemented not as a RAM array but as a collection of discrete storage elements (such as flip-flops or registers).

Figure 30:
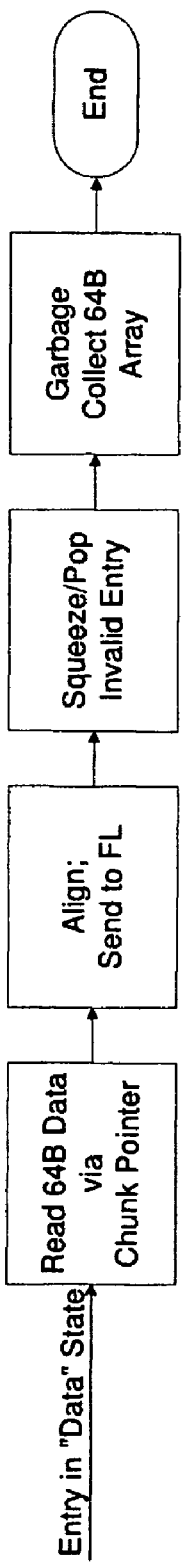
FIG. 30 illustrates a flow diagram of selected operating aspects of an embodiment of MBS FLane read return path register file write processing.

FIG. 30 illustrates processing resulting in FLane register file write transactions for entries that have matched a returning data chunk address (i.e. entries in the Data state). The oldest entry in the Data state is selected and read. The associated 64 B chunk data RAM pointer is used to access the chunk data RAM, and the read data is aligned according to the low portion of the address and the size of the read request tracked by the entry. The aligned data and the register file identifier are sent to the FLane using a credit based flow control. It is then the responsibility of the FLane to store the data into the appropriate register.

The entry transitions to the Invalid state when the register file write transaction has been accepted by the FLane. Entries are managed by age by shifting younger entries to fill the Invalid entry. If the Invalid entry is the oldest of all entries, then it is popped. A check is made to determine if any remaining entries in the Data state point to the 64 B chunk data RAM location that has just been read. If so, the location is still in use. If not, then the location is no longer in use, and is free for storage of a new data return.

In the aforementioned embodiment there is no attempt to determine, as a new read request is logged in the CAM/RAM unit, if the new request would be satisfied by a request currently stored in the CAM/RAM. However, such requests do not need to be passed to the MLanes. Some embodiments eliminate this type of unnecessary request by including at least a second Search port on the CAM section of the CAM/RAM, as well as other additional control hardware. Other embodiments search for matching data in the chunk RAM at the time the new read request is logged in the CAM/RAM unit (or any time before then, up until the earliest time the read request address is available), according to various implementations that typically include additional pointers and an additional address CAM.

Figure 31:
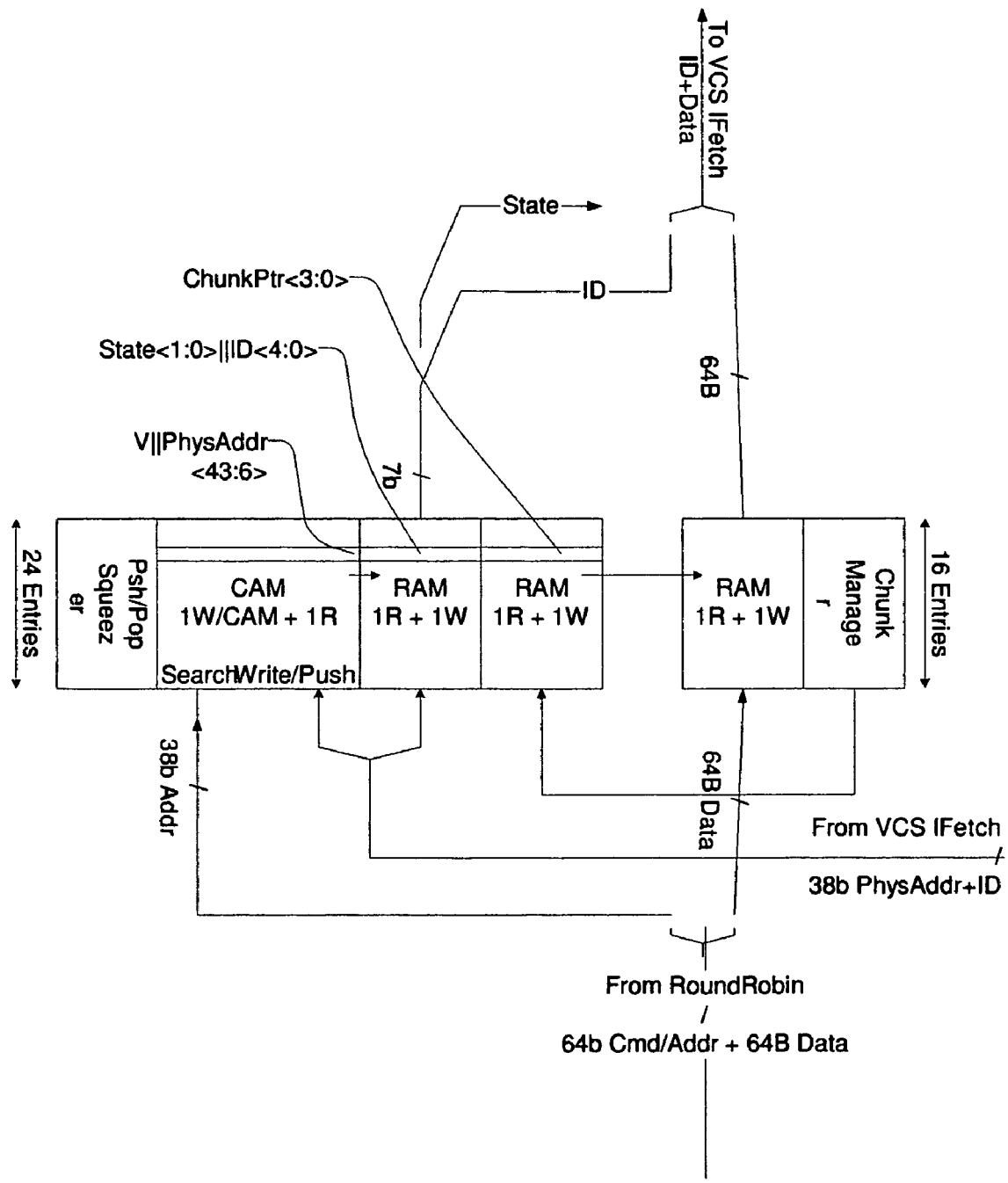
FIG. 31 illustrates selected aspects of an embodiment of an MBS instruction fetch read return path block.

FIG. 31 illustrates an instance of the IFRdRet interface block that processes read returns 560 (as broadcast by the 4:1 round robin) into individual instruction fetch return transactions for delivery to VCS. Instruction fetch requests from VCS are tagged with an identifier (ID), and the ID is returned to VCS along with returning read data matching a previous requested fetch address (allowing data returns in any order with respect to the fetch requests). Operation and structure of IFRdRet is similar to MLRdRet, except that data is returned 64 B at a time, is constrained to satisfy at most one outstanding request (and invalidated after one use, in order to simplify Sync processing), and a fetch ID is used rather than a register identifier.

Memory Lane

The Memory system is partitioned into 4 MLanes. At the heart of each MLane is a Northbridge that includes support for a direct connect SMP system architecture.

Northbridge

The Northbridge handles all off chip communications, memory coherency, and memory accesses. The Northbridges in the four MLanes are connected via coherent HT links to provide coherent memory operations for the 16 FB-DIMM channels.

Northbridge Functions

The Northbridge includes hardware blocks performing several functions, including: interfacing to scalar and vector processor transactions (CPUI), providing coherent and non-coherent HT links (cHT and cHT/HT), independently interfacing to DRAM channels (MC), error correcting code conversion, filtering read and write probes to reduce coherency traffic to other nodes, and a crossbar transport of data between the various functions.

The read/write probe filter eliminates read and write probes to memory locations that are not in any cache of any node in a coherency domain. It includes a 4-byte tag per scalar core cache line.

In some embodiments the vector processor implements SECDED error correcting codes with the DRAMs, while in other embodiments a Reed-Solomon ECC is implemented instead, enabling ChipKill functionality with a single DIMM of x4 DRAMs. The Northbridge error correcting code conversion provides necessary translation between the DRAM error correction scheme and any internal vector processor error correction scheme (such as SECDED), according to various embodiments.

Some Northbridge implementations provide double word writes to memory without a 64 B line being read from memory. Some Northbridge implementations provide support for transactions that are processed as not allocating in any cache (as the vector processor has no cache), yet search caches to maintain coherency, and may be processed in any order. Some Northbridge and FB-DIMM implementations provide support for write masks to ECC memory, including Reed-Solomon ECC memory. In some embodiments Read-Modify-Write (RMW) operations (such as byte writes) are performed under the direct control of MBS, while in other embodiments the RMW operations are directed by the Northbridge. In some embodiments the Northbridge provides 8 B of return data per cycle, while in other embodiments 16 B of data are provided. In some embodiments one of the plurality of Northbridges functions as a master, with the remaining Northbridges functioning as slaves. In other embodiments the Northbridges operate as peers. In some embodiments the Northbridge includes a mode bit to enable response to PCI configuration space accesses to vector processor registers.

In some embodiments interrupts are signaled from the vector processor to the scalar processor via ports on the Northbridge, while in other embodiments the interrupts are signaled via the HT links.

SMP Vector Processing

Figure 32:
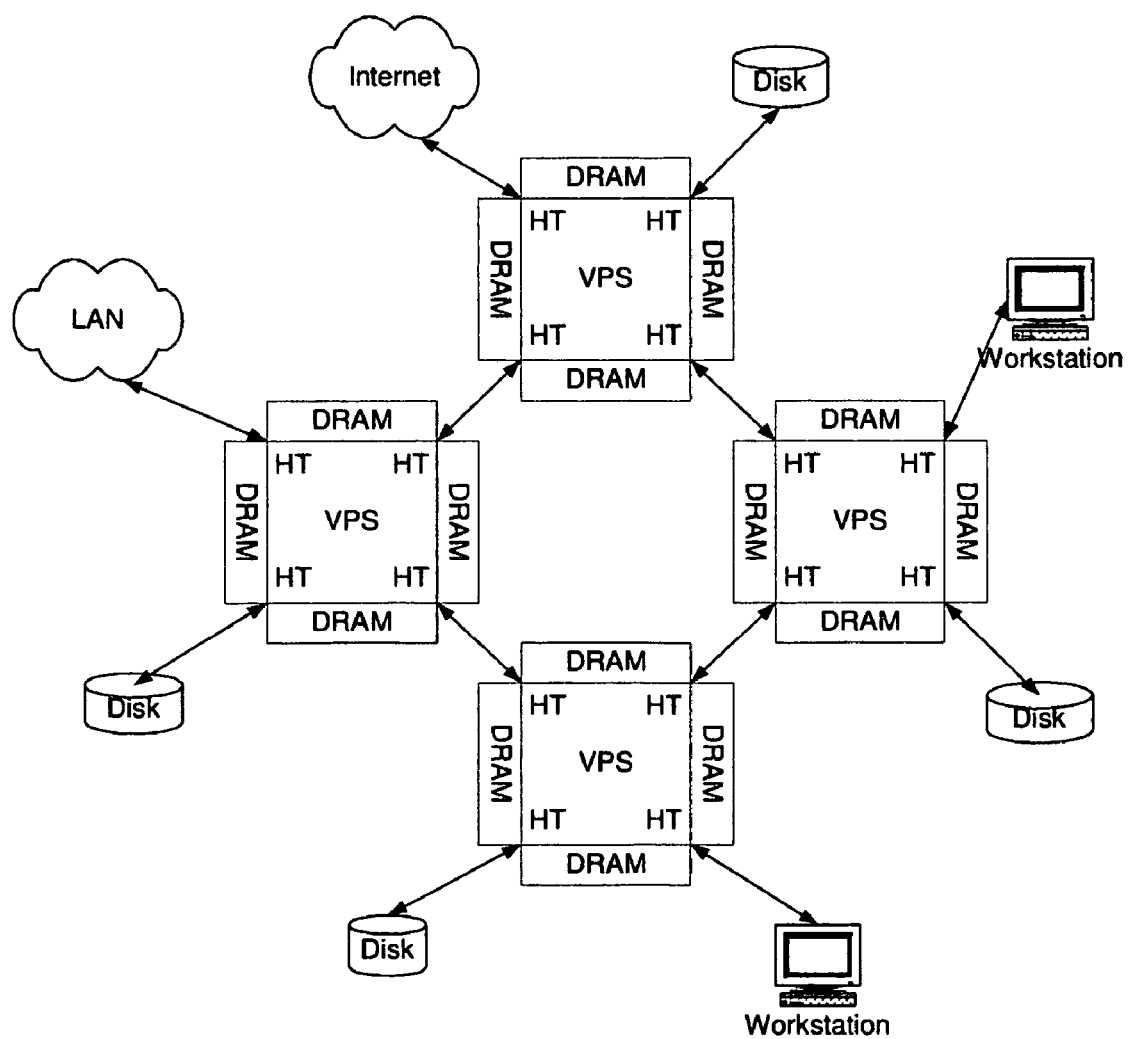
FIG. 32 illustrates an embodiment of a Symmetric Multi-Processing (SMP) VPS.

FIG. 32 illustrates an embodiment of an SMP VPS, including a plurality of VPSs coupled via HT links, and I/O couplings to network, disk, and client workstations. In some embodiments the I/O couplings include one or more protocol conversion elements, such as converting between HT and Ethernet, Fibre Channel, or similar I/O specific interface protocol.

In some embodiments the DRAMs coupled to all of the VPSs collectively operate in a single unified physical memory space, and the HT links communicate memory system coherency transactions, enabling VPSs to access remote DRAMs (i.e. DRAMs coupled to VPSs other than itself). In some embodiments each VPS and its associated plurality of directly coupled DRAMs operates in a separate physical memory space, and the HT links communicate non-coherent message type interprocessor communication information.

Error Detection/Correction

In typical embodiments larger collections of state are protected by error detection/correction circuitry (such as ECC logic). Such state collections include register files such as the CRF, and ARF, and most of the CAM/RAM arrays implemented in the MBS.

Conclusion

Although the foregoing embodiments have been described in some detail for purposes of clarity of understanding, the invention is not limited to the details provided. There are many alternative ways of implementing the invention. The disclosed embodiments are illustrative and not restrictive. It will be understood that many variations in construction, arrangement and use are possible consistent with the teachings and within the scope of the claims appended to the issued patent. For example, interconnect and function-unit bit-widths, clock speeds, and the type of technology used may generally be varied in each component block. Also, unless specifically stated to the contrary, the value ranges specified, the maximum and minimum values used, or other particular specifications (such as the number of FLanes, MLanes, and scalar cores), are merely those of the illustrative embodiments, can be expected to track improvements and changes in implementation technology, and should not be construed as limitations.

Functionally equivalent techniques known to those of ordinary skill in the art may be employed instead of those illustrated to implement various components or sub-systems. The names given to interconnect and logic are merely illustrative, and should not be construed as limiting the concepts taught. It is also understood that many design functional aspects may be carried out in either hardware (i.e., generally dedicated circuitry) or software (i.e., via some manner of programmed controller or processor), as a function of implementation dependent design constraints and the technology trends of faster processing (which facilitates migration of functions previously in hardware into software) and higher integration density (which facilitates migration of functions previously in software into hardware). Specific variations may include, but are not limited to: differences in integrated circuit die partitioning; circuit macro details and selection of elements for implementation as circuit macros; and other variations to be expected when implementing the concepts taught herein in accordance with the unique engineering and business constraints of a particular application.

The embodiments have been illustrated with detail and environmental context well beyond that required for a minimal implementation of many of aspects of the concepts taught. Those of ordinary skill in the art will recognize that variations may omit disclosed components without altering the basic cooperation among the remaining elements. It is thus understood that much of the details disclosed are not required to implement various aspects of the concepts taught. To the extent that the remaining elements are distinguishable from the prior art, omitted components are not limiting on the concepts taught herein.

All such variations in design comprise insubstantial changes over the teachings conveyed by the illustrative embodiments. It is also understood that the concepts taught herein have broad applicability to other computing and networking applications, and are not limited to the particular application or industry of the illustrated embodiments. The invention is thus to be construed as including all possible modifications and variations encompassed within the scope of the claims appended to the issued patent.

What is claimed is:

1. A system including: a plurality of floating point execution units compatible with operation according to a plurality of execution threads;
    a plurality of memory channels each configured to access at least one Dynamic Randomly Accessible read/write Memory (DRAM) element;
    a memory buffer switch unit coupling the floating point execution units to the memory channels;
    an instruction control unit configured to control the floating point execution units according to a stream of vector instructions, wherein the multiple floating point execution units operate concurrently on parts of the same vector instruction;
    wherein the parts of multiple vector instructions are executed independently by the separate floating point execution units;
    wherein the parts of the vector instructions are completed out of order with respect to the parts in other floating point execution units;
    a processor interface compatible with an x86 processor and configured to receive the stream of vector instructions from the x86 processor, wherein the x86 processor controls the plurality of floating point units through a compatible interface;
    wherein the x86 processor, and the plurality of floating point units share access to coherent memory;
    and wherein the memory buffer switch is configured to consolidate at least two memory requests from the floating point execution units into a single memory access operation directed to one of the memory channels and the at least two memory requests are processed according to a coherency domain implemented by the x86 processor.

2. The system of claim 1 wherein the floating point execution units and the processor interface are implemented in a single integrated circuit die.

3. The system of claim 2 wherein the integrated circuit die and the x86 processor are included in a multi-chip module.

4. The system of claim 1 wherein the x86 processor controls a first one of the execution threads and another x86 processor controls a second one of the execution threads.

5. The system of claim 1 further including a cache tag data structure to track cache state changes of the x86 processor according to the coherency domain.

6. The system of claim 1 wherein the at least two memory requests are unordered in the hardware and memory ordering is restored with coherency commands issued by software.

7. The system of claim 1 with 64 floating point execution units and 16 FB-DIMM channels in a single chip.

8. The system of claim 1 with a filter to eliminate unnecessary memory probes for both reads and writes.

9. A system including: a plurality of floating point execution units compatible with operation according to a plurality of execution threads;
   a plurality of memory channels each configured to access at least one Dynamic Randomly Accessible read/write Memory (DRAM) element;
   a memory buffer switch unit coupling the floating point execution units to the memory channels;
   an instruction control unit configured to control the floating point execution units according to a stream of vector instructions;
   a processor interface compatible with an x86 processor and configured to receive the stream of vector instructions from the x86 processor wherein the parts of the vector instructions are completed out of order with respect to the parts in other floating point execution units,
   and wherein the memory buffer switch is configured to consolidate at least two memory requests from the floating point execution units into a single memory access operation directed to one of the memory channels and the at least two memory requests are processed according to a coherency domain implemented by the x86 processor.

10. The system of claim 9 wherein the parts of multiple vector instructions are executed independently by the separate floating point execution units.

11. The system of claim 10 wherein the multiple floating point execution units operate concurrently on parts of the same vector instruction.

12. The system of claim 11 wherein the x86 processor controls the plurality of floating point units through a compatible interface and the x86 processor.

13. The system of claim 12 wherein the plurality of floating point units share access to coherent memory.

14. The system of claim 9 wherein the x86 processor controls the plurality of floating point units through a compatible interface and the x86 processor.

15. The system of claim 14 wherein the plurality of floating point units share access to coherent memory.

* * * * *